(12) United States Patent
Huffman

(10) Patent No.: US 11,784,648 B2
(45) Date of Patent: Oct. 10, 2023

(54) LOW POWER INTERCONNECT USING RESONANT DRIVE CIRCUITRY

(71) Applicant: Power Down Semiconductor, Inc., Fremont, CA (US)

(72) Inventor: David A Huffman, Fremont, CA (US)

(73) Assignee: Power Down Semiconductor, Inc., Fremont, CA (US)

( * ) Notice: Subject to any disclaimer, the term of this patent is extended or adjusted under 35 U.S.C. 154(b) by 0 days.

(21) Appl. No.: 17/750,398

(22) Filed: May 23, 2022

(65) Prior Publication Data

US 2022/0393684 A1  Dec. 8, 2022

Related U.S. Application Data

(60) Provisional application No. 63/212,530, filed on Jun. 18, 2021, provisional application No. 63/196,080, filed on Jun. 2, 2021.

(51) Int. Cl.
*H03K 19/17736* (2020.01)
*H03K 19/17704* (2020.01)
*H03K 19/17728* (2020.01)
*H03K 19/1776* (2020.01)

(52) U.S. Cl.
CPC ... *H03K 19/17744* (2013.01); *H03K 19/1776* (2013.01); *H03K 19/17704* (2013.01); *H03K 19/17728* (2013.01)

(58) Field of Classification Search
None
See application file for complete search history.

(56) References Cited

U.S. PATENT DOCUMENTS

| | | | |
|---|---|---|---|
| 4,617,479 A | 10/1986 | Hartmann | |
| 4,758,746 A | 7/1988 | Birkner | |
| 5,734,285 A | 3/1998 | Harvey | |
| 5,781,469 A | 7/1998 | Pathak | |
| 7,307,871 B2 | 12/2007 | Liaw | |
| 7,746,921 B1 | 6/2010 | Wik | |
| 10,510,399 B2* | 12/2019 | Huffman | H10B 10/00 |

(Continued)

FOREIGN PATENT DOCUMENTS

| | | | |
|---|---|---|---|
| JP | 2006221769 A | 8/2006 | |
| WO | 9934368 A2 | 7/1999 | |
| WO | 03088459 A2 | 10/2003 | |

OTHER PUBLICATIONS

PCT Written Opinion for app. PCT/US 22/31722.

(Continued)

*Primary Examiner* — Anh Q Tran
(74) *Attorney, Agent, or Firm* — Patent Law Group; Brian Ogonowsky

(57) ABSTRACT

A field programmable gate array (FPGA) comprises a set of configurable logic blocks (CLBs), input/output blocks (IOBs), and interconnect wiring for communicating data between the CLBs and IOBs. A resonating circuit provides a resonating signal to the circuit blocks. The circuit blocks provide the resonating signal to the interconnect wires to communicate a first binary value, and a static voltage to communicate a second binary value. The output signals of the circuit blocks change state when the resonating signal is at or near the static voltage. This reduces switching losses that exist within prior art FPGAs.

25 Claims, 35 Drawing Sheets

(56) References Cited

U.S. PATENT DOCUMENTS

| | | |
|---|---|---|
| 2003/0039165 A1 | 2/2003 | Shau |
| 2004/0037154 A1 | 2/2004 | Abedifard |
| 2004/0252546 A1 | 12/2004 | Liaw |
| 2007/0063252 A1 | 3/2007 | Yuan |
| 2008/0205112 A1 | 8/2008 | Lawson |
| 2009/0059697 A1 | 3/2009 | Adams |
| 2018/0211698 A1* | 7/2018 | Huffman ............... G11C 11/418 |
| 2018/0218768 A1 | 8/2018 | Huffman |
| 2019/0095568 A1 | 3/2019 | Bezzam |

OTHER PUBLICATIONS

Hyundai, HY18CV8 data sheet, Apr. 1991.
Moon et al, An Efficient Charge Recovery Logic Circuit, IEEE Journal of SSC, vol. 31, No. 4, Apr. 4, 1996.
Maksimovic et al., Integrated Power Clock Generators for Low Energy Logic, IEEE 1995.
Hu et al., A Novel Low Power Adiabatic SRAM With an Energy Efficient Line Driver, IEEE 2004.
Hu et al., Low Power Dual Transmission Gate Adiabatic Logic Circuit and Design of SRAM, IEEE 2004.
Kim et al., Energy Recovery Static Memory, ISLPED '02, Aug. 12, 2002.
Tzartzanis et al., Energy Recovery for the Design of High-Speed, Low-Power Static RAMS, ISLPED 1996.

* cited by examiner

LOW POWER INTERCONNECT USING RESONANT DRIVE CIRCUITRY

This application claims priority based on U.S. provisional patent applications 63/196,080, filed Jun. 2, 2021 by David A. Huffman, and 63/212,530, filed Jun. 18, 2021 by David A. Huffman, each of which is entirely incorporated herein by reference.

BACKGROUND OF THE INVENTION

This invention relates to integrated circuits (ICs), and in particular, to reducing the switching power losses due to the wire connections between circuit blocks on-chip. This invention also relates to methods and circuits for low-power signal routing between circuits on-chip.

It is well known in the art of electronics that any wire possesses some degree of capacitive loading which increases power consumption when that wire is switched from either a high logic state to a low logic state or vice versa. The power dissipation $P_{diss}$ for a fixed-frequency clock signal driving a wire can be described with the equation $P_{diss}=C*V^2*f$ where C is the capacitance being driven, V is the supply voltage of the driver, and f is the frequency of the clock signal. A long wire trace with high-frequency switching consumes more power than a shorter segment of the same wire trace driven from the same source with low-frequency switching. There are various types of ICs that have interconnect wiring which dominate the overall power consumption and others that have transistor logic devices that dominate the power consumption. One particular class of IC that has a tremendous amount of wire connectivity with a corresponding large amount of switching power consumption is the Field Programmable Gate Array (FPGA). FIG. 1 shows that more than 80% of a typical FPGA's dynamic power consumption comes from the capacitive loading of signal and clock wire traces within the IC. (FIG. 1 is taken from T. Tuan et al., "A 90-nm Low-Power FPGA for a Battery-Powered Application", IEEE Trans. on Computer-Aided Design, Vol. 26, no. 2, pp. 296-300, February 2007, incorporated herein by reference.)

Examples of publications describing FPGA interconnect power consumption include:
1. Rohini Krishnan et al., "Low Energy FPGA Interconnect Design," Conference: Proceedings of the 14th ACM Great Lakes Symposium on VLSI 2004, Boston, Mass., USA, Apr. 26-28, 2004".
2. Jason H. Anderson et al., "Low-Power Programmable FPGA Routing Circuitry," *IEEE/ACM International Conference on Computer Aided Design*, San Jose, Calif., 2004, pp. 602.609.
3. V. George and J. Rabaey, "*Low-Energy FPGAs: Architecture and Design*," Boston, Mass.: Kluwer Academic Publishers, 2001.
4. Singh, P., and Vishvakarma, S. K. Device/circuit/architectural techniques for ultra-low power FPGA design. *Microelectronics and Solid State Electronics* 2, A (2013), 1-15. 5.
5. Li, F., Lin, Y., and He, L. Vdd programmability to reduce FPGA interconnect power. In *Proceedings of the 2004 IEEE/ACM International conference on Computer-aided design* (2004), IEEE Computer Society, pp. 760-765.
6. Shang, L., Kaviani, A. and Bathala, K. Dynamic power consumption in the Virtex-II FPGA family. In *ACM/SIGDA International Symposium on Field Programmable Gate Arrays*, pp. 157-164.
7. Weitong Chen, Lei Li, Peng Lu and Jinmei Lai, "Design of FPGA's high-speed and low-power programmable interconnect," 2016 13th IEEE International Conference on Solid-State and Integrated Circuit Technology (ICSICT), Hangzhou, 2016, pp. 707-709, doi: 10.1109/ICSICT.2016.7999018.

These references are incorporated herein by reference.

It is common for electronic systems (including computers) to include FPGA chips to provide programmable logic which is often used to increase the flexibility of the system, fix hardware bugs by changing configuration data and/or reduce the time-to-market for the product. Many of these FPGA chips are used in battery-powered mobile applications where power consumption must be minimized for cost and/or performance reasons.

FIG. 2a shows a common FPGA architecture that includes configurable logic blocks (CLBs) 2, switch matrices (SMs) 4 and input/output blocks (IOBs) 6 along with the horizontal and vertical routing channels HRC, VRC which interconnect CLBs 2 and IOBs 6. FIGS. 2b and 2c illustrate in greater detail how one of CLBs 2 is programmably coupled to routing channels HRC, VRC via programmable connections PC located within a connection box (CB) 5. Programmable connections PC1, for example, is a switch between CLB horizontal input lead LB and a vertical wire VW. This switch is controlled by configuration data loaded into the FPGA. As can be seen, the structure of FIG. 2b permits programmable connection of input leads LA, LB, LC and LD and output lead LY of CLB 2 to be coupled to a number of different wires within routing channels HRC, VRC. Once a particular wire has been programmably coupled using the configuration data to receive an output signal from an output lead LY of a particular CLB 2, no other CLB or IOB output lead may be coupled to provide an output signal onto that particular wire unless that other CLB or IOB provides an output signal identical to that particular CLB2 (e.g. two CLBs with the same configuration data and input signals connected in parallel). However, several CLB input leads may be coupled to a given wire as required to perform a particular logic function or set of logic functions that utilize that same output signal. SM blocks 4 permit wires within the vertical routing channels VRC to be coupled to wires within the horizontal routing channels HRC, and vice versa, to thereby couple the output signal to propagate either horizontally or vertically depending on the final destination(s) of that particular output signal.

FIG. 3 shows an example of a CLB 2 with a 4-input look-up table (LUT) 8 to implement the programmed logic function along with an output flip-flop (FF) 10 to latch the data from LUT 8, and a multiplexer M1 which selects the registered (latched) versus unregistered (pass-through) logic function before driving an output lead LY, depending upon configuration data stored in a memory cell CM1. The output signal Y from CLB 2 passes through various CBs 5 and/or SMs 4 to drive either another CLB or an JOB. Prior to use (e.g. upon system power-up), the FPGA is loaded with configuration data. Some of that data is stored in the LUTs to determine the logic function to be performed by CLBs 2. Other parts of the configuration data control SM blocks 4, CBs 5, and other ancillary functions found in the IOBs 6.

FIG. 4 illustrates a simple LUT comprising sixteen data registers R for storing sixteen bits of configuration data, four input signals A, B, C, D and a set of multiplexers M2 for selecting one of registers R and providing the contents of the selected register R on an output lead 9. By loading registers R with appropriate configuration data LUT 8 can provide any logic function of the four input signals.

FIG. 5a shows an example of a switch matrix 4 which is located within the dashed box area and consists of 10 interconnect points IP. Each interconnect point IP comprises six switches S1 to S6 (FIG. 5b) used to route a signal from any wire IW connected to an interconnect point IP to any other wire IW connected to that interconnect point IP based on the programming of that interconnect point.

Switch matrices (SMs) 4 and connection boxes (CBs) 5 are programmed to direct a signal from one CLB to other CLBs in order to realize an overall desired logical function. FIG. 6 provides an example of how many wires exist in some routing channels. There are busses which "direct connect" to adjacent CLBs, busses that span the length of two CLBs, busses that connect over "long" distances, and "global clock" busses that typically connect to a large group of CLBs for time synchronization, etc. A single vertical routing channel VRC is 45 wires in this diagram. Wiring comprises a significant percentage of the chip's capacitive loading which, in turn, causes a significant percentage of the dynamic switching power consumption of the FPGA. (See FIG. 1). This dynamic switching power is converted into heat which reduces the reliability of the FPGA over time and adds to the overall cost of the system design.

SUMMARY

One object of the invention is to reduce power consumption by interconnect wiring that connects blocks of circuitry. In one embodiment, this is accomplished by providing a resonating signal to interconnect wires to communicate data from one circuit block within an array of blocks to one or more other circuit blocks within the array. The blocks typically perform various combinatorial logic functions, e.g. addition, subtraction, etc., and also typically contain memory elements.

In one embodiment, a resonant circuit provides a resonant signal (typically a sine wave) to the blocks within the array. The blocks typically comprise a set of one or more input leads and one or more output leads. The output leads are coupled to one or more routing wire segments that make up the interconnect wiring. A block couples the resonant circuit to drive a first output lead with the resonant signal to communicate a binary value (e.g. a binary 1) via that first output lead. When it is desired to output a new binary value (e.g. a binary 0) onto the first output lead, the block drives the first output lead with a first binary voltage (which in this embodiment, is a static voltage, e.g. a DC voltage) to thereby communicate the new value. The block changes the state of its output signal when the resonating signal is at its minimum voltage, which is the first binary voltage (corresponding to a binary 0). The power dissipation exhibited by the CLB-to-CLB (or CLB-to-IOB) communication is reduced because there are no $CV^2 \ast f$ switching losses associated with the interconnect wires.

In another embodiment, the block also drives a second output lead to communicate a binary value that is the opposite of the binary value communicated on the first output lead. Thus, when the block drives the first output lead with the resonating signal, the block drives the second output lead with the first binary voltage, and when the block drives the first output lead with the first binary voltage, the block drives the second output lead with the resonating signal. The block changes the state of the second output signal at a time when the resonating signal is at its minimum voltage, which is the first binary voltage. Thus, again, switching losses exhibited by the CLB-to-CLB or CLB-to-IOB signal communication are reduced.

In one embodiment, the capacitive loading of the first output lead cooperates with the resonant circuit when the resonating signal is applied to the first output lead to establish the resonating frequency of the resonating signal. Similarly, the capacitive loading of the second output lead cooperates with the resonant circuit when the resonating signal is applied to the second output lead to establish the resonating frequency of the resonating signal. The capacitive loading of the first and second output leads are equal. Thus, the resonating frequency does not change when the output signals change state.

In one embodiment, circuitry elsewhere in the array (e.g. within the interior of the blocks) uses binary voltages, and the first binary voltage corresponds to a binary 0. This circuitry uses a second binary voltage to communicate a binary 1. The resonating signal typically resonates between the voltage equal to the first binary voltage and the second binary voltage.

In another embodiment, circuitry within the interior of the blocks uses the resonating signal to perform logic, arithmetic functions or provide point-to-point communication to thereby reduce power dissipation.

The output leads of the blocks are typically coupled to interconnect wiring within the array by switches. These "coupling switches" increase the capacitive loading on the block output leads. However, because of the manner in which the blocks use the resonating signal, the switching losses exhibited when the block output signals change state is reduced compared to switching losses using conventional binary voltage switching.

In one embodiment, each block comprises an input latch for latching input signals at a time when the resonating signal is at its maximum peak voltage, which is the second binary voltage. If the latch receives the resonating signal at that time, the latch stores a binary 1. If, on the other hand, the latch receives the first binary voltage at that time, the latch stores a binary 0. The latched signal is communicated to circuitry in the interior of the block, e.g. a LUT.

In one embodiment, the array comprises an input/output IOB circuit that receives a binary input signal from a source external to the array, typically in the form of binary voltages. In response thereto, the input/output circuit provides either the resonating signal or the binary voltage on an input/output circuit output lead to communicate a binary 1 or a binary 0, respectively, depending upon the state of the binary input signal. Of importance, the input/output IOB circuit changes the state of its output signal when the resonating signal is at the first binary voltage. Therefore, the input/output circuit exhibits reduced switching losses compared to prior art binary voltage switching.

In one embodiment, the input/output IOB circuit can be configured to receive a signal from a block within the array. The signal from the block can be either the resonating signal (corresponding to a binary 1) or the first binary voltage (corresponding to a binary 0). The input/output IOB circuit latches the signal from the array at a time when the resonating signal is at the second binary voltage. Thus, the latch stores the first binary voltage if the input/output circuit is receiving the first binary voltage from the array, but stores the second binary voltage if the input/output IOB circuit is receiving the resonating signal.

In one embodiment, the resonating circuit provides a second resonating signal that is the inverse of the first resonating signal. The array includes a second group of circuit blocks. Each circuit block within the second group receives the second resonating signal and provides that second resonating signal on a first output lead when that block is in a first state, and provides a second binary voltage on that first output lead when that block is in a second state.

In one embodiment a second group of input/output circuits receive the second resonating signal. Each input/output circuit within the second group provides either the second resonating signal or the second binary voltage in response to an input signal received from a source external to the array.

In one embodiment, a third resonating signal is provided to the blocks and input/output circuits. The third resonating signal controls the timing of memory circuits (e.g. latches) within the blocks and input/output circuits. A timing control circuit within the blocks and input/output circuits generates a timing control signal (e.g. pulses) to control the timing of the memory circuits. An array in accordance with this embodiment consumes less energy than it would if it employed a prior art binary clock signal.

In yet another embodiment, third and fourth resonating signals are provided to the blocks and input/output circuits. The fourth resonating signal is a version of the third resonating signal delayed by a predetermined delay time. The timing control circuit generates pulses in response to the third and fourth resonating signals. The widths of the pulses are established by the delay time.

In one embodiment, the array is an FPGA, the circuit blocks are CLBs, and the input/output circuits are IOBs. The configuration data for the FPGA is either a volatile or non-volatile memory (e.g. SRAM cells, EPROM cells, latches, flip-flops, a shift register, EEPROM cells, or fuse type memory cells). In another embodiment, the array is mask programmable. In yet another embodiment, the blocks are ICs on a printed circuit board, and the interconnect wiring comprises traces on the printed circuit board.

BRIEF DESCRIPTION OF THE DRAWINGS

FIG. 12b illustrates the RLC equivalent of the crystal in FIG. 12a.

DETAILED DESCRIPTION

Figure 7:
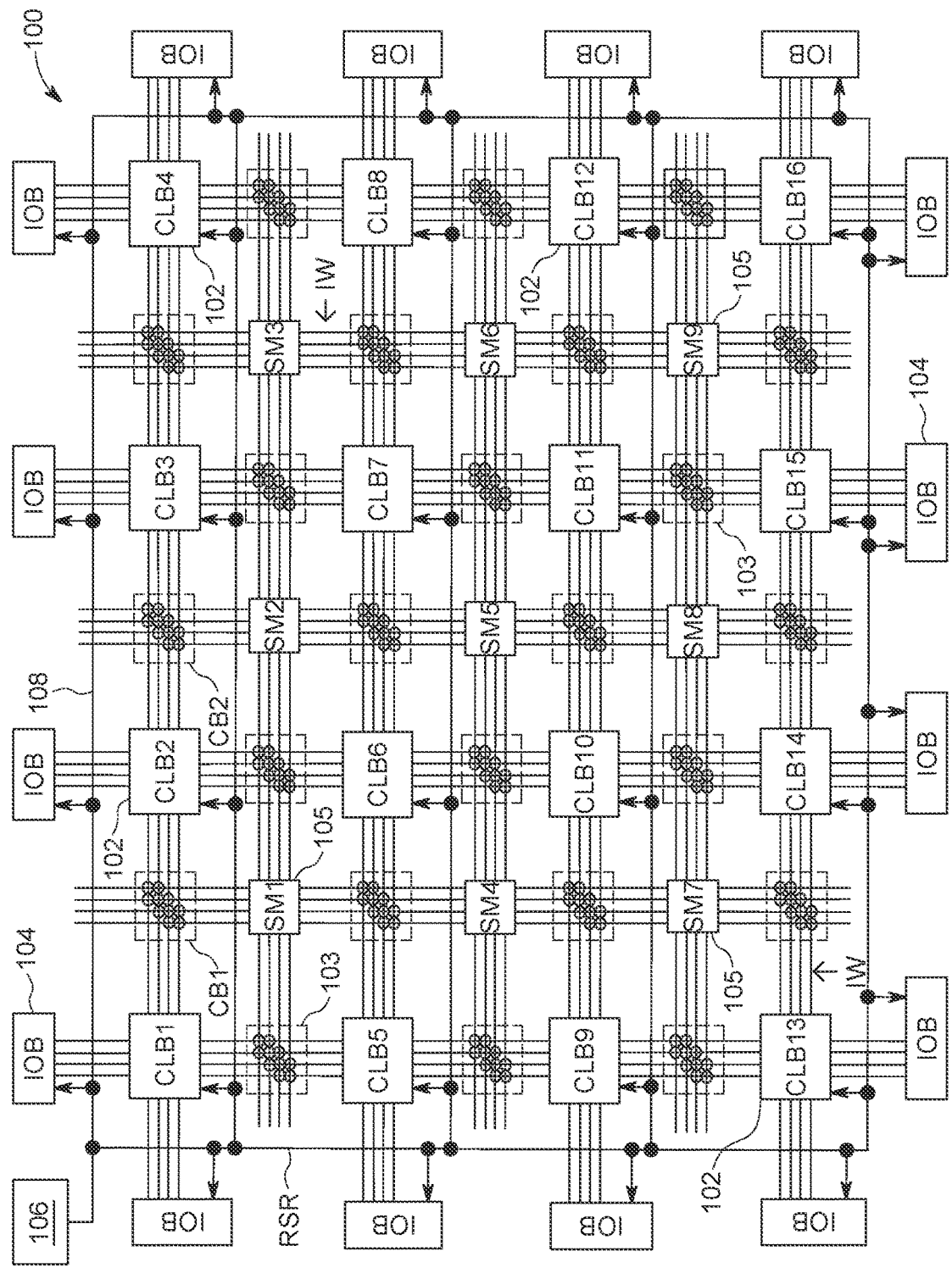
FIG. 7 is a simplified block diagram of an FPGA constructed in accordance with an embodiment of the invention.

Referring to FIG. 7, an FPGA 100 in accordance with the invention comprises an array of CLBs 102 for performing logic and/or other functions, a set of IOBs 104 around the periphery of the array for receiving input signals from outside the FPGA and providing output signals to circuits outside the FPGA, a set of interconnect wires IW for communicating signals between CLBs 102, and also communicating signals between CLBs 102 and IOBs 104, a set of connection boxes CBs 103 for connecting CLBs 102 to interconnect wires IW, and a set of switch matrices 105 for connecting horizontal or vertical interconnect wires IW to other interconnect wires IW. In accordance with one novel feature of the invention, FPGA 100 includes a resonating circuit 106 for providing a resonating signal RSR on an output wire 108 to each of CLBs 102 and IOBs 104. Signal RSR is typically a sine wave, and in one embodiment, resonates between 1 and 2 volts. Also, the logic levels and rail voltages of the circuitry internal to CLBs 102 and IOBs 104 are 1 volt for a binary 0 and 2 volts for a binary 1. However, as explained below, in other embodiments signal RSR resonates between other voltages, and the circuitry internal to the CLBs 102 and IOBs 104 can use other voltages.

As explained below, in accordance with one novel feature of the invention, CLBs 102 and IOBs 104 drive interconnect wiring IW with either resonating signal RSR (to communicate a binary 1) or a DC voltage (typically 1 volt) to communicate a binary 0. By doing this, FPGA 100 exhibits reduced switching power losses that otherwise occur in prior art FPGAs.

Figure 8:
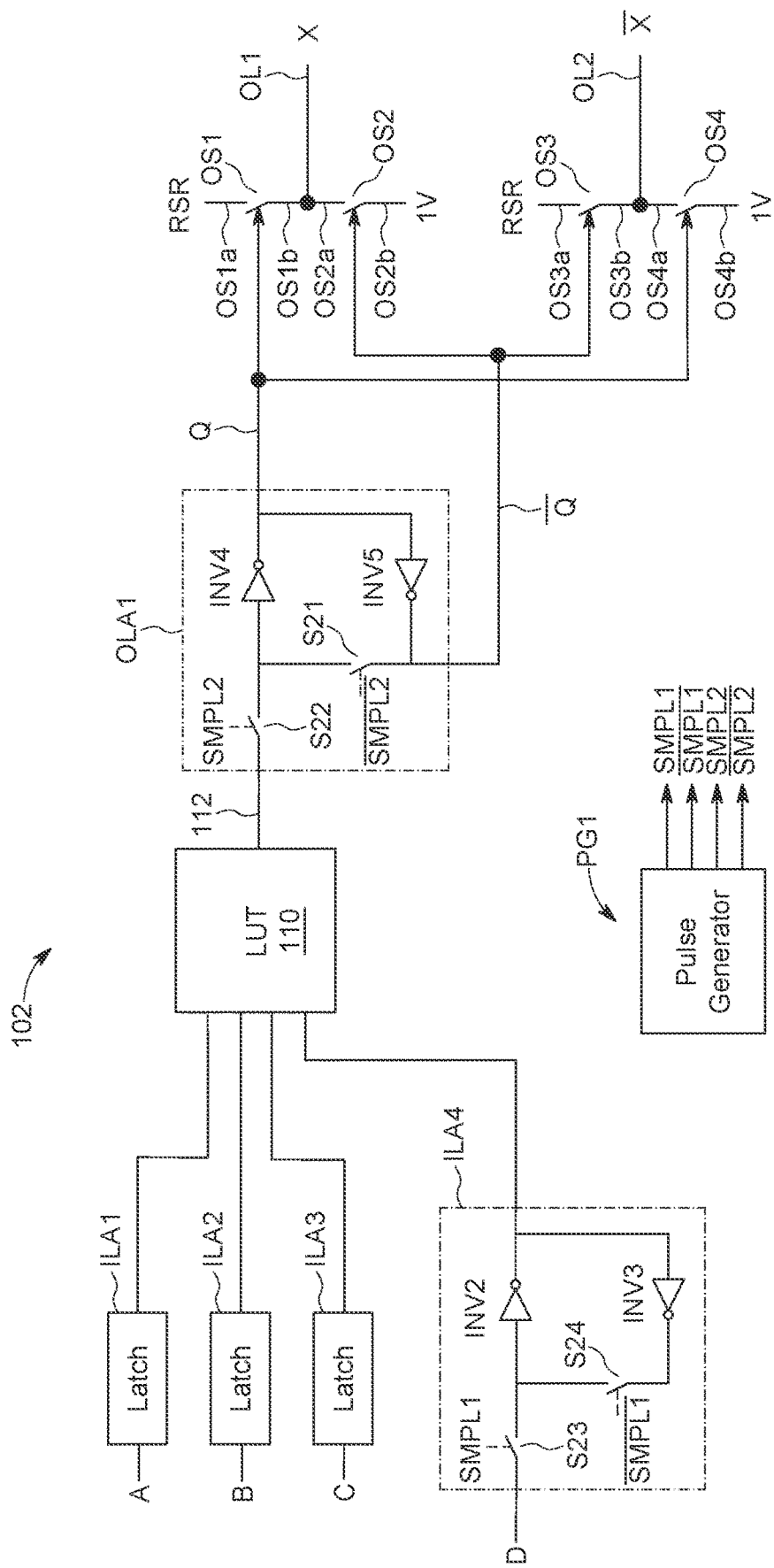
FIG. 8 illustrates a CLB within the FPGA of FIG. 7.

Also, as explained below, when a binary 1 is communicated on one of interconnect wires IW in FPGA 100, instead of providing a DC high voltage on that interconnect wire, resonating signal RSR is provided on that interconnect wire. The CLBs FIG. 8 illustrates CLB 102 within FPGA 100. CLB 102 comprises four input latches ILA1 to ILA4 for receiving input signals A, B, C and D from interconnect wiring IW. Latches ILA1 to ILA4 provide input signals to a LUT 110. In one embodiment, LUT 110 is a 16:1 multiplexer which selects one of 16 configuration data bits. These configuration data bits are programmed by a user to enable LUT 110 to perform a desired logic function. A LUT output lead 112 is coupled to an input lead of an output latch OLA1 which stores the LUT output signal in response to clock pulses SMPL2 and $\overline{SMPL2}$. (As can be seen, clock pulses SMPL2 and $\overline{SMPL2}$ control switches S22 and S21 within latch OLA1, respectively, to thereby control the storing of data within latch OLA1.) Output latch OLA1 provides output signals Q and $\overline{Q}$ to control output switches OS1 to OS4. Output switches OS1 and OS3 also receive resonating signal RSR via wire 108. When signal Q is a binary 1, output switch OS1 couples signal RSR to an output lead OL1, switch OS2 is open, switch OS4 couples output lead OL2 to receive a DC voltage of 1 volt, and switch OS3 is open. Alternatively, when signal Q is a binary 0, switch OS1 is open, switch OS2 couples output lead OL1 to receive 1 volt, switch OS3 couples signal RSR to output lead OL2, and switch OS4 is open. In this way, switches OS1 to OS4 provide CLB output signals X and $\overline{X}$ on output leads OL1 and OL2, respectively. Switches OS1 and OS3 typically comprise parallel NMOS and PMOS transistors to avoid a threshold voltage drop across those switches. (If switches OS1 and OS3 were only NMOS transistors, a threshold voltage drop would exist across switches OS1 and OS3 when signal RSR is at a high voltage and being applied to output leads OL1 and OL2, respectively. If switches OS1 and OS3 were only PMOS transistors, a threshold voltage would exist across switches OS1 and OS3 when one attempts to apply a low voltage to output leads OL1 and OL2, respectively.) Switches OS2 and OS4 can comprise an NMOS transistor.

It will be appreciated that when signal Q is a binary 1, signal $\overline{Q}$ is a binary 0, lead OL1 receives signal RSR, and lead OL2 is at 1 volt. Conversely, when signal Q is a binary 0 and signal $\overline{Q}$ is a binary 1, lead OL1 is at 1 volt and lead OL2 receives signal RSR. The presence of signal RSR on an output lead OL1, OL2 indicates a binary 1. The presence of 1 volt on an output lead OL1, OL2 indicates a binary 0.

Output leads OL1 and OL2 connect CLB 102 to wiring segments within interconnect wiring IW, which in turn couples leads OL1 and OL2 to other CLBs (or IOBs) within FPGA 100 via connection boxes 103 and/or switch matrices 105 and other coupled segments of interconnect wiring IW.

Of importance, latch OLA1 receives clock pulses SMPL2 and $\overline{SMPL2}$ from a pulse generator PG1. Pulses SMPL2 and $\overline{SMPL2}$ are only active when signal RSR is at or near 1 volt. Because of this, the signals on output leads OL1, OL2 only change state, if at all, when signal RSR is at or near 1 volt. This means that output switches OS1 to OS4 only change state when the voltage on leads OS1a to OS4a and OS1b to OS4b of switches OS1 to OS4 is at 1 volt, and thus there are no voltage discontinuities and switching losses when output switches OS1 to OS4 change state. Thus, FPGA 100 avoids switching power losses that are present in conventional prior art FPGAs.

As mentioned above, LUT 110 receives input signals A to D via input latches ILA1 to ILA4. (Latch ILA4 is illustrated in detail in FIG. 8. Latches ILA1 to ILA3 are identical to latch ILA4.) Latches ILA1 to ILA4 are also clocked by pulse generator PG1 which generates pulses SMPL1 and $\overline{SMPL1}$ when signal RSR is at the top of its voltage swing (typically 2 volts). Thus, when signal RSR is received on an input lead of latch ILA1 for example (corresponding to a binary 1 on that input lead), latch ILA1 is clocked when signal RSR is at its peak voltage, and thus latch ILA1 stores a binary 1 and presents that binary 1 to an associated input lead of LUT 110. Conversely, if latch ILA1 receives a binary voltage of 1 volt (corresponding to a binary 0), latch ILA1 stores that binary 0. In this way, CLB input latch ILA1 is clocked at a time when it can store a binary value indicating whether it is receiving a binary 1 or a binary 0 from interconnect wiring IW and thereafter provides binary output voltages to LUT 110 in response thereto. Input latches ILA2 to ILA4 operate in the same manner.

It will be appreciated that latches ILA1 to ILA4 need not store their input signals A to D precisely at the instant when signal RSR is at its highest point. As long as signals A to D are stored at a time when signal RSR is at a sufficiently high voltage to be interpreted by latches ILA1 to ILA4 as a binary 1, signals A to D will be stored properly. Although one need not sample signals A to D at the exact peak of signal RSR, there may be some additional power consumption as the sampled wire will get pulled to the appropriate peak voltage after sampling the sine wave.

The IOBs

Figure 9:
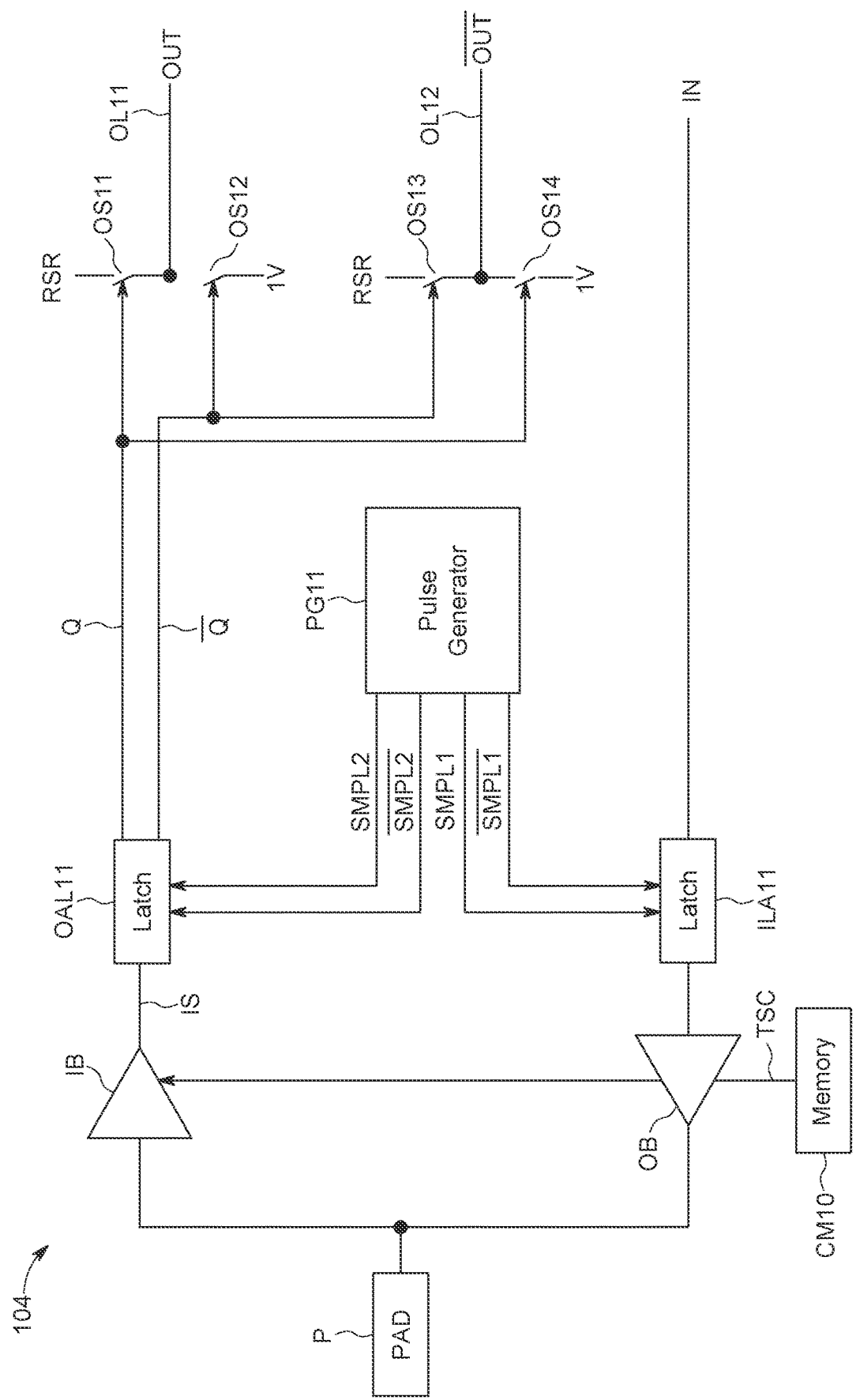
FIG. 9 illustrates an IOB within the FPGA of FIG. 7.

FIG. 9 illustrates IOB 104. IOB 104 can function as either an input port or an output port. When functioning as an input port, IOB 104 receives an input signal IS from a source external to the FPGA via an I/O pad P and an input buffer IB. In one embodiment, the signal received on I/O pad P uses binary voltage levels of 0 and 3 volts to communicate a binary 0 or a binary 1, respectively. Input buffer IB generates in response thereto a buffered signal using binary voltage levels of 1 and 2 volts to communicate a binary 0 and a binary 1, respectively. The signal from input buffer IB is stored in an output latch OLA11 (identical to latch OLA1) in response to pulses SMPL2 and $\overline{SMPL2}$ from pulse generator PG11. (Pulse generator PG11 is typically identical to pulse generator PG1, and generates pulses SMPL2 and $\overline{SMPL2}$ when signal RSR is at its minimum value and pulses SMPL1 and $\overline{SMPL1}$ when signal RSR is at its maximum value.)

Latch OLA11 is connected to and controls the state of output switches OS11 to OS14 in the same manner that latch OLA1 is connected to and controls switches OS1 to OS4. Thus, when output signal Q of latch OLA11 is a binary 1, output signal $\overline{Q}$ of latch OLA11 is a binary 0, switch OS11 provides signal RSR on output lead OL11 to communicate a binary 1, switch OS12 is open, switch OS14 drives output lead OL12 with 1 volt to communicate a binary 0, and switch OS13 is open. Conversely, when output signal Q of latch OLA11 is a binary 0, output signal $\overline{Q}$ of latch OLA11 is a binary 1, switch OS12 applies 1 volt to output lead OL11 to communicate a binary 0, switch OS11 is open, switch OS13 provides resonating signal RSR to lead OL12 to communicate a binary 1, and switch OS14 is open. In one embodiment, output leads OL11 and OL12 are coupled via interconnect wires IW to a CLB.

Because latch OLA11 changes state when signal RSR is at a minimum, switches OS11 to OS14 change state when signal RSR is at a minimum, and the voltage at each lead of switches OS11 to OS14 is the same (1 volt). Thus, there are no voltage discontinuities at any of the leads of switches OS11 to OS14, therefore there are reduced switching losses compared to prior art FPGAs.

When IOB 104 functions as an output port, a latch ILA11 receives an input signal via one of interconnect wires IW from one of CLBs 102. Latch ILA11 is typically identical to latches ILA1 to ILA4 within CLB 102 and is clocked when signal RSR is at its peak value by pulse generator PG11. Thus, if signal RSR is present on the input lead of latch ILA11 (indicative of a binary 1), when clocked, latch ILA11 stores a binary 1. If the input signal received by latch ILA11 is at 1 volt (indicative of a binary 0) latch ILA11 stores a binary 0. Latch ILA11 drives a tristate output buffer OB, which then provides a binary signal to a destination external to the FPGA via I/O pad P, typically using binary voltage levels of 0 and 3 volts. Tristate output buffer OB receives a tristate control signal TSC from a memory cell CM10 which stores a bit of the configuration data within the FPGA. Alternatively, signal TSC can be generated by one of the CLBs 102 within FPGA 100.

It will be appreciated that signal TSC enables tristate output buffer OB when IOB 104 provides an output signal to I/O pad P. Signal TSC is coupled to and disables input buffer IB when IOB 104 provides an output signal to I/O pad P. Similarly, signal TSC puts output buffer OB in a tristate mode and enables input buffer IB when IOB 104 receives an input signal from I/O pad P.

Again, it will be appreciated that latch ILA11 need not be clocked precisely at the instant when signal RSR is at its peak. Rather, signal RSR need only be sufficiently high so that it is interpreted by latch ILA11 as a binary 1.

In one embodiment, each CLB 102 on the periphery of array 100 is coupled to one or more IOBs 104 to thereby receive or send signals to a destination outside array 100. In another embodiment, the IOBs 104 are programmably connected to a set of interconnect wires that permit the IOBs to communicate with any of a set of CLBs.

Resonant Circuit for Generating Signal RSR

Figure 10:
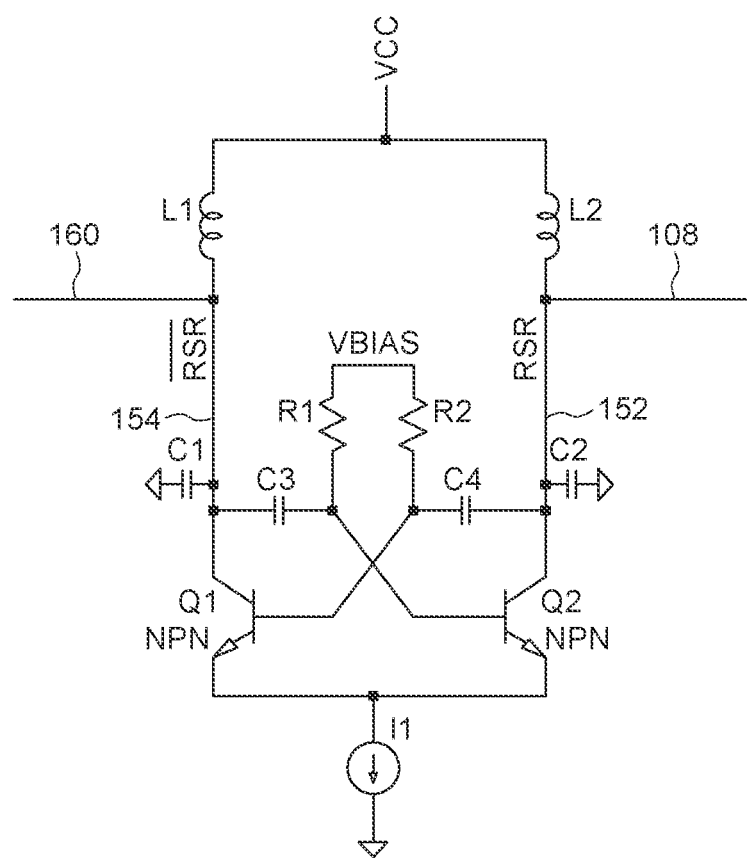
FIG. 10 illustrates an LC resonating circuit using bipolar transistors.
Figure 11:
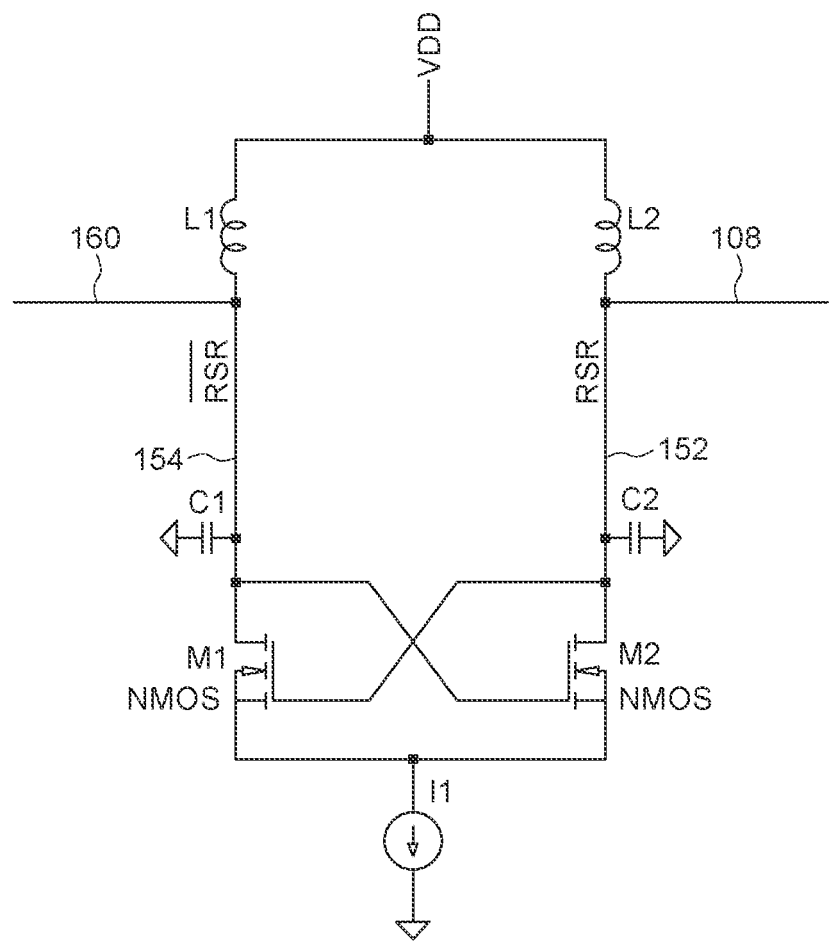
FIG. 11 illustrates an LC resonating circuit using MOS transistors.

One type of resonant circuit comprises an inductor and capacitor in a series or parallel configuration. FIGS. 10 and 11 illustrate examples of resonant circuits comprising inductors and capacitors, using bipolar and MOS transistors, respectively. LC resonant circuits are well-known in the art. Such resonant circuits can be used as circuit 106 in FIG. 7 to provide resonating signal RSR.

Capacitors store energy in the electric field across the two plates. Inductors store energy in magnetic flux linkages which circulate around a current-carrying conductor. By connecting the capacitor and inductor in series or parallel, a "tank" circuit is created whereby energy can be transferred back and forth between the capacitor and the inductor as current moves charge back and forth between the two components. Maximum energy is stored on the capacitor when the current equals zero. Maximum energy is stored on the inductor when the current reaches a peak. The only energy losses (neglecting "radiant" energy) come from heat dissipation from any parasitic resistance found in the signal path. Thus, using a resonant circuit offers a significant advantage in terms of a circuit's power efficiency.

As the input signals received by IOBs 104 change state, CLBs 102 in FPGA 100 perform logic functions and change the state of their output signals, some wires within interconnect wiring IW are coupled to resonant circuit 106 (via wire 108, CLBs 102 and IOBs 104), and other wires within interconnect wiring IW are decoupled from resonant circuit 106. The wire segments within wiring IW exhibit some amount of capacitance and provide part of the total capacitive loading on resonant circuit 106. It is desirable to maintain the capacitive loading on resonant circuit 106 constant, even as various wires are coupled to and decoupled from resonant circuit 106 and hare held at a static DC voltage. Otherwise, the frequency Wo of resonant circuit 106 will change based on the formula:

$$\omega_0 = \frac{1}{\sqrt{LC}}$$

(The switch resistance and other parasitic resistances will offset the frequency from the ideal $\omega_0$. These resistances are fixed and will not cause the frequency to vary over time.) In this formula "C" represents the total effective capacitance seen by the resonant tank circuit in parallel with the inductor (or the crystal), and includes capacitances of wire 108 and those wires within interconnect wiring IW to which resonating circuit 106 is coupled.

Because the total capacitive loading on resonant circuit 106 depends on how FPGA 100 is programmed, switching frequency $\omega_0$ of FPGA 100 may differ depending upon the FPGA programming. However, once programmed, frequency $\omega_0$ will remain constant, even as the input signals to the FPGA 100 change.

A typical FPGA configuration may leave some CLBs unused. In one embodiment, some or all of the unused CLBs may be connected to interconnect wires IW to increase capacitive loading on resonant circuit 106 to ensure a desired total capacitive loading on circuit 106 and therefore a desired resonating frequency $\omega_0$. This can be done to ensure that for any given logic configuration, the resonating circuit 106 will have the same frequency.

Figure 12A:
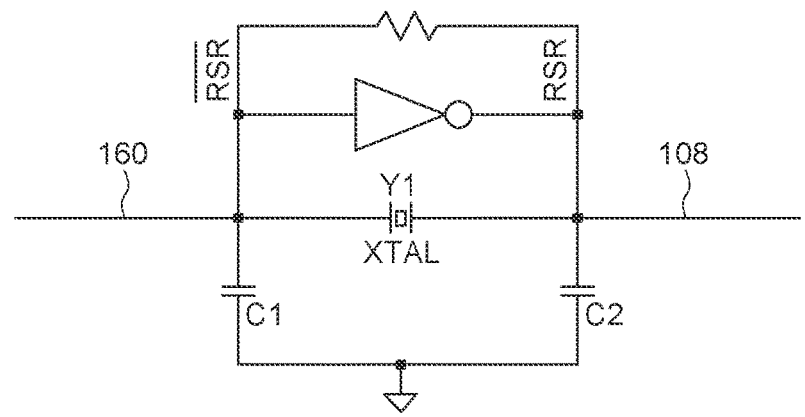
FIG. 12a illustrates a crystal oscillator circuit using a crystal as the inductive element.
Figure 12B:
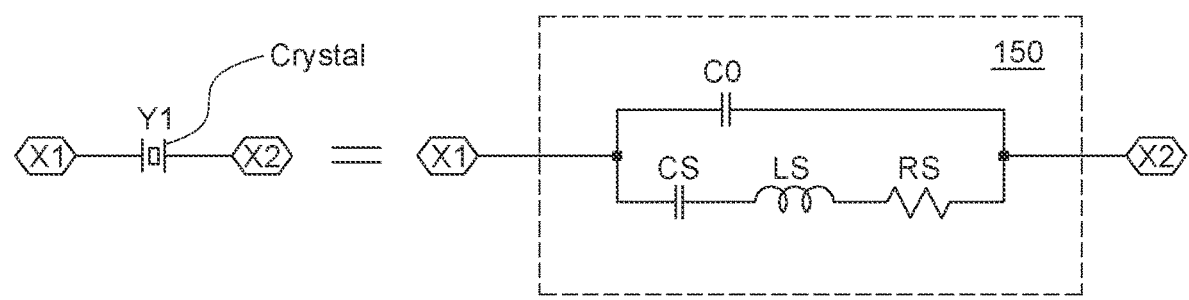

A crystal can also be used to resonate in a resonant circuit although that aspect of its behavior that can be modeled as an inductor does not come from a coil, but rather the "motional" inductance of the crystal mass which vibrates when electrically stimulated. One type of well-known crystal resonant circuit is a Pierce Oscillator. FIGS. 12a and 12b show a crystal Y1 and an RLC equivalent circuit 150. Both the inductor and the capacitors in circuit 150 are "energy-storing" elements.

Pulse Generators PG1 and PG11

Figure 13:
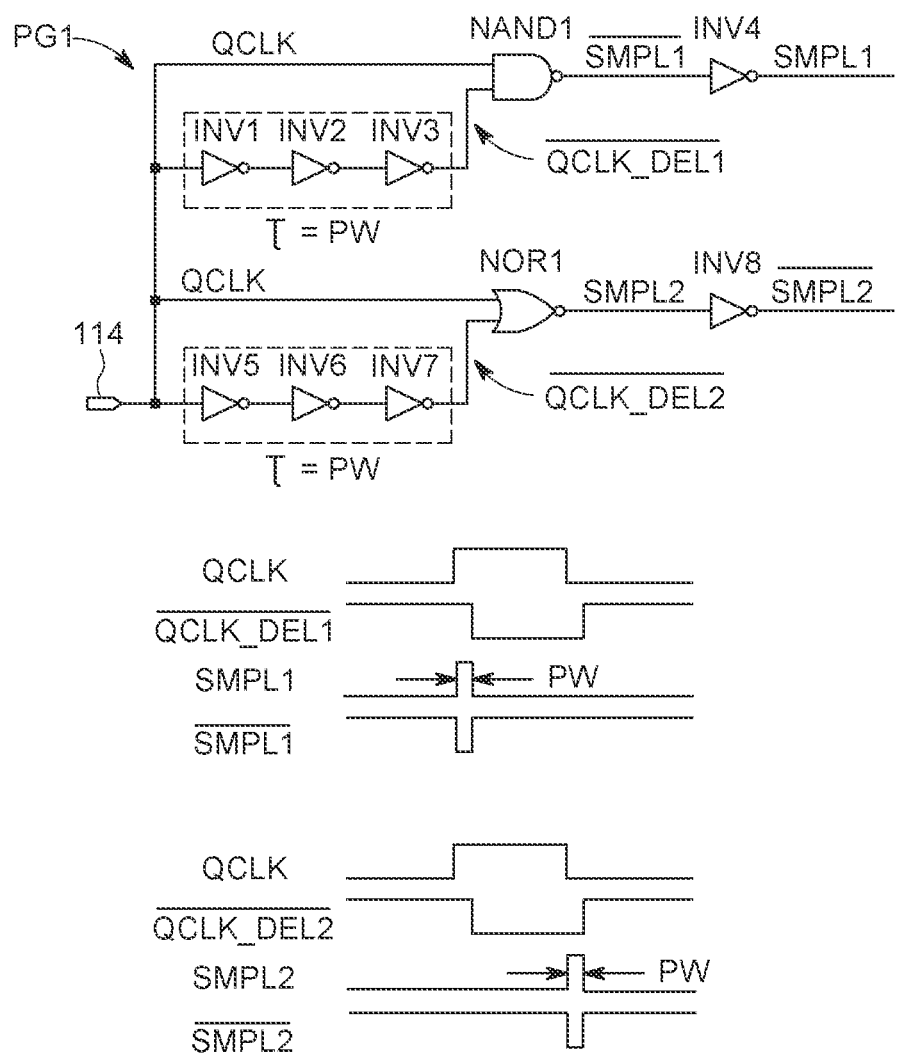
FIG. 13 illustrates a first embodiment of a pulse generator for use in the CLB of FIG. 8.

As mentioned above, each CLB 102 contains latch OLA1 for storing the output signal from LUT 110 and synchronizing the switching of data signals so that they occur when signal RSR is at 1 volt. FIG. 13 illustrates a first embodiment of pulse generator PG1 which provides pulse signals SMPL1 and $\overline{\text{SMPL1}}$ that cause input latches ILA1 to ILA4 to store the input signals to LUT 110. (As mentioned above, pulse generator PG11 within IOB 104 can be the same as pulse generator PG1.)

Figure 23:
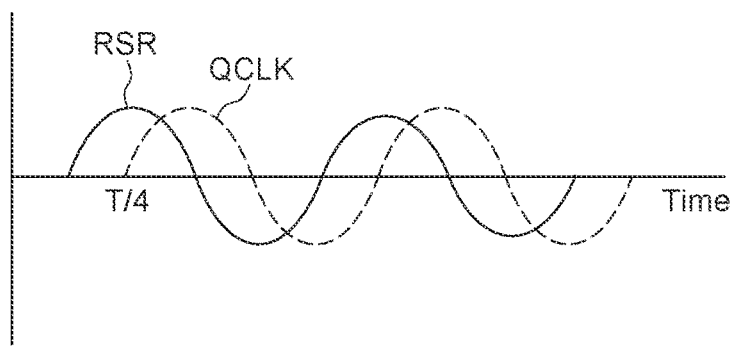
FIG. 23 shows the phase relationship between the in-phase resonating signal RSR and a quadrature clock (QCLK) signal after the phase-locked loop has reached its steady-state condition.

Pulse generator PG1 receives a resonating input signal QCLK on an input lead 114. As explained below, signal QCLK is a resonating signal that has a frequency equal to that of signal RSR but delayed by about 90 degrees. (FIG. 23 shows the timing relationship between signals RSR and QCLK.) In one embodiment, signals QCLK and RSR resonate between 1 and 2 volts. Signal QCLK is received by a series of CMOS inverters INV1 to INV3 and a CMOS NAND gate NAND1. The rail voltages of inverters INV1 to INV3 and gate NAND1 are typically 1 and 2 volts and the threshold voltage of their transistors is typically about 0.35 volts. Because of the delay caused by inverters INV1 to INV3, pulse generator PG1 generates a pulse having a width corresponding to this delay when signal QCLK rises above 1.35 volts. This pulse width PW is typically about 1 ns for a digital system where the clock period is greater than or equal to 20 ns. However, in other embodiments, other pulse widths can be used but should be sufficiently wide to ensure that the correct value is captured by latch ILA1 and the other latches that use signals SMPL1 and $\overline{\text{SMPL1}}$.

Figure 21:
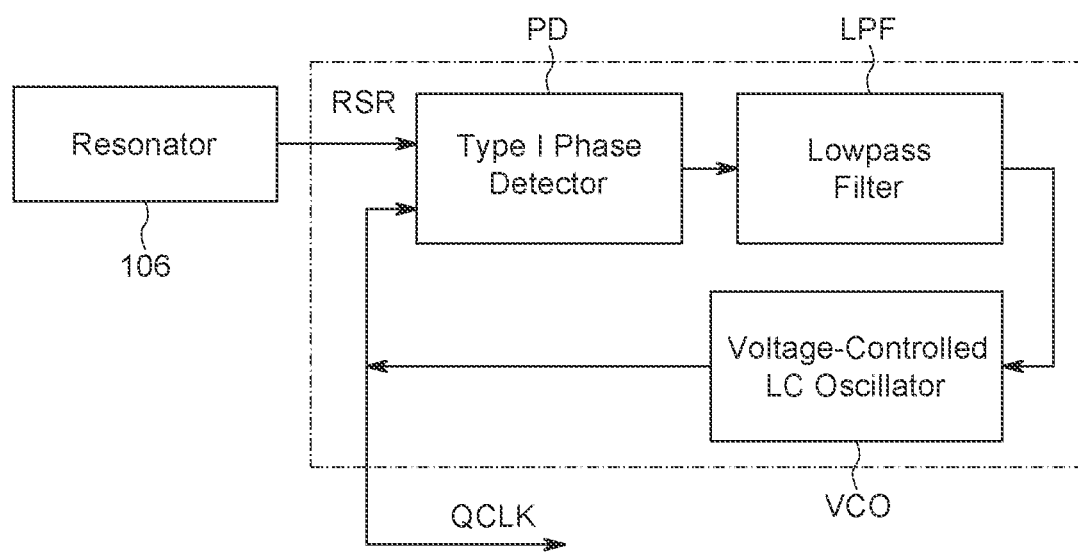
FIG. 21 illustrates a simplified phase-locked loop (PLL) circuit for generating timing control signals for use in conjunction with CLBs and IOBs in an embodiment of the invention.
Figure 22:
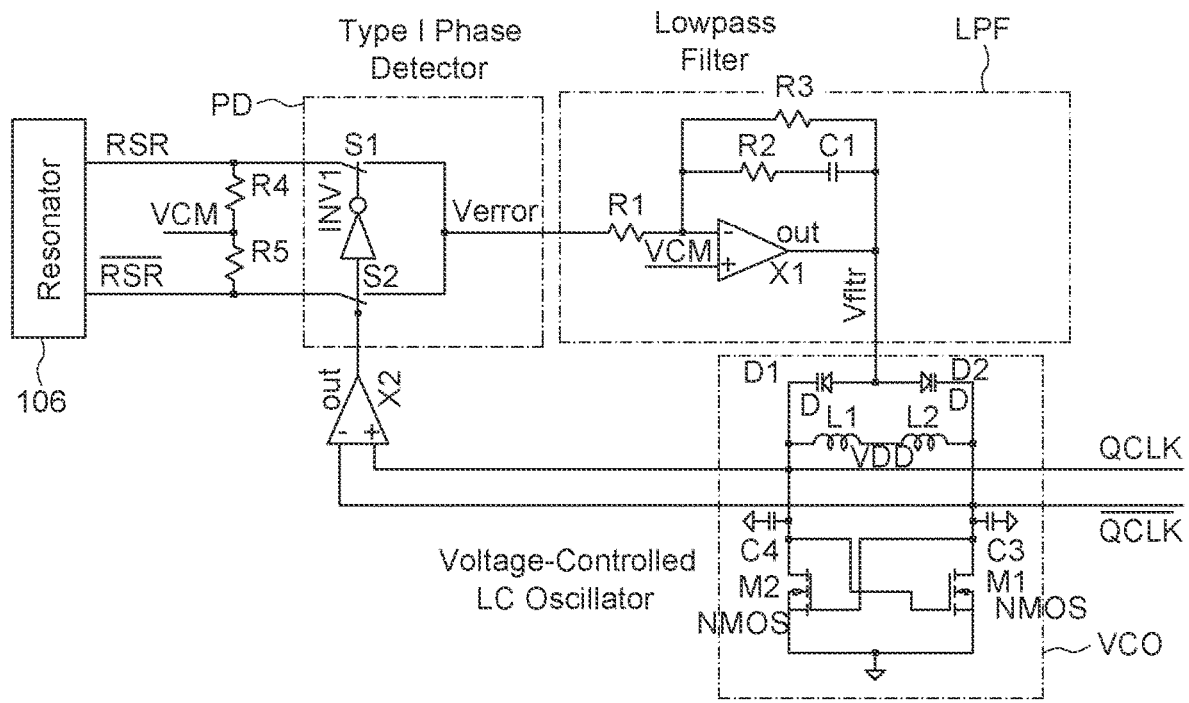
FIG. 22 schematically illustrates in greater detail the phase-locked loop (PLL) circuit of FIG. 21.

FIG. 21 illustrates a phase-locked loop for generating signal QCLK. Phase-locked loops are well-known in the art. In one embodiment, the phase-locked loop of FIG. 21 comprises a phase detector PD, a low pass filter LPF, and a voltage-controlled oscillator VCO. FIG. 22 illustrates a more detailed example of circuitry that can be used for the phase-locked loop in FIG. 21. However, other types of phase-locked loops can also be used. The phase-locked loop of FIGS. 21 and 22 receive signal RSR and signal $\overline{\text{RSR}}$ from resonant circuit 106. Signal $\overline{\text{RSR}}$ is the same as, but 180 degrees out of phase with, signal RSR.

Alternatively, a programmable delay circuit or a delay locked loop circuit can be used in lieu of a phase-locked loop to generate signal QCLK. Delay-locked loops and programmable delay circuits are also well known in the art.

Also illustrated in FIG. 13 is a circuit comprising inverters INV5 to INV7 and a NOR gate NOR1. This portion of pulse generator PG1 generates signals SMPL2 and $\overline{\text{SMPL2}}$ in a manner similar to the generation of signals SMPL1 and $\overline{\text{SMPL1}}$ described above. As mentioned above, signals SMPL2 and $\overline{\text{SMPL2}}$ control the timing for output latch OLA1.

Figure 14A:
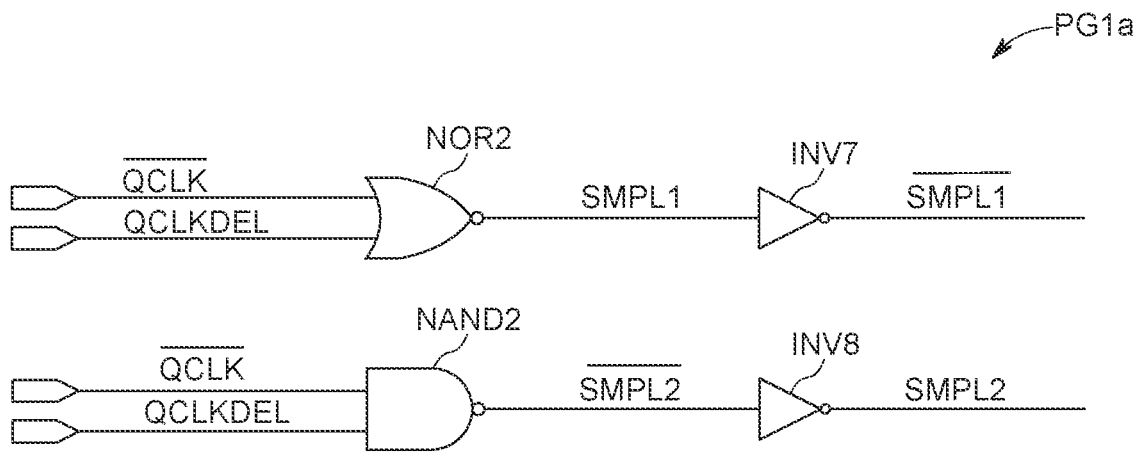
FIG. 14a illustrates a second embodiment of a pulse generator for use in the CLB of FIG. 8.

FIG. 14a illustrates a second embodiment of a pulse generator PG1a that can be used in lieu of pulse generator PG1. Pulse generator PG1a comprises, a CMOS NAND gate NAND2 which generates signal $\overline{\text{SMPL2}}$ and a CMOS inverter INV8 that inverts signal $\overline{\text{SMPL2}}$ to generate signal SMPL2. Signal SMPL2 controls switches S22 in latch OLA1, and signal $\overline{\text{SMPL2}}$ controls switch S21 in latch OLA1. (Switches S21 and S22 are typically implemented as CMOS transistors.) NOR gate NOR2 generates signal SMPL1 from signals $\overline{\text{QCLK}}$ and QCLKDEL. As explained above, signal QCLK is also a resonating signal (typically a sine wave) that lags signal RSR by 90 degrees. Signal QCLKDEL is a resonating signal (typically a sine wave) that lags signal QCLK by a small amount (typically 1 ns for a digital system where the clock period is greater than or equal to 20 ns, depending on the time needed for the flip-flops to latch incoming signals).

Figure 24:
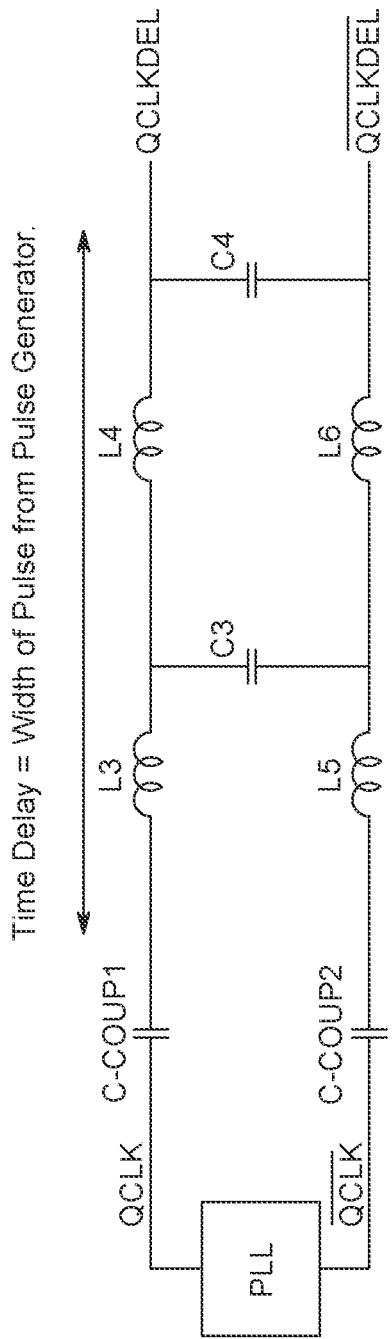
FIG. 24 illustrates an LC delay low pass filter for generating a delayed version of a resonating signal.
Figure 25:
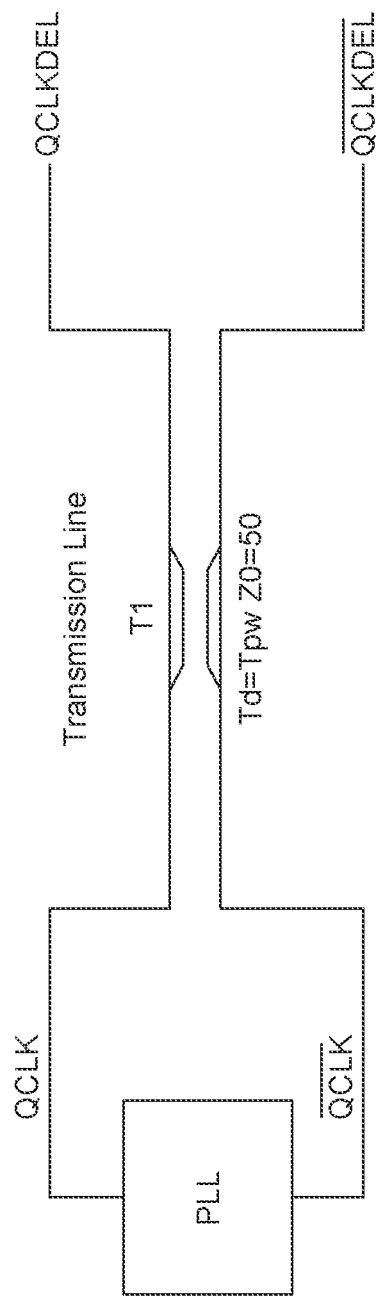
FIG. 25 illustrates a transmission line for generating a delayed version of a resonating signal.

In one embodiment, the delayed version of QCLK (namely QCLKDEL) is generated using an LC delay low pass filter (see FIG. 24) or a transmission line (see FIG. 25). The LC delay (or transmission line) can be implemented on- or off-chip depending on the amount of delay required and the availability of on-chip inductors of the proper sizing. Generating a pulse with this method requires less power than the inverters and NAND gate of pulse generator PG1.

It will be appreciated that the sinusoidal signal QCLK may have a phase delay with respect to RSR of less than 90 degrees due to the intrinsic delay of gate NOR2. The QCLK delay with respect to RSR may be adjusted such that the signal SMPL1 and $\overline{\text{SMPL1}}$ are aligned (preferably centered or slightly early) with the voltage peaks of the RSR sinusoidal waveform.

Pulse generator PG1a also includes a NOR gate NOR2 and inverter INV7 for generating signals SMPL1 and $\overline{\text{SMPL1}}$. As can be seen in FIG. 8, signals SMPL1 and $\overline{\text{SMPL1}}$ control switches S23 and S24 in latches ILA1 to ILA4. Switches S23 and S24 are typically implemented as PMOS and NMOS transistors in parallel.

Figure 15A:
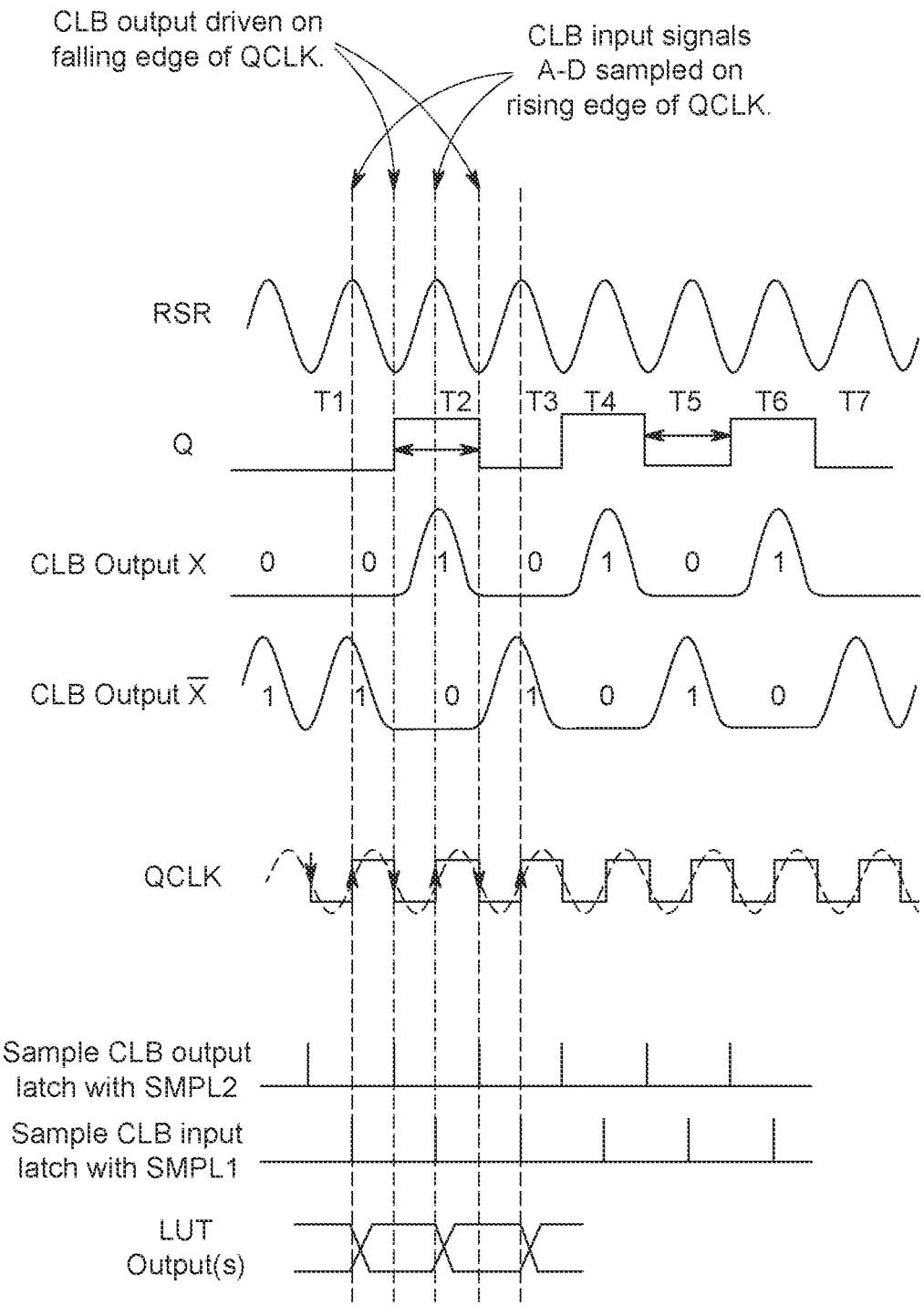
FIG. 15a is a timing diagram showing the relationship between various signals within the CLB of FIG. 8.

FIG. 15a is a timing diagram showing the relationship between signals RSR, QCLK, output latch signal Q, CLB output signals X and $\overline{\text{X}}$, and the output signal from LUT 110. As can be seen, signal Q and the states of the output signals X and $\overline{\text{X}}$ on leads OL1 and OL2 only change when signal RSR is at its minimum, e.g., at the falling edge of signal QCLK. FIG. 15a also illustrates the relationship between the timing of signal RSR and the sampling of the CLB input signals A to D. CLB input signals A to D are sampled by latches ILA1 to ILA4 when signal RSR is at its maximum, coinciding with the rising edge of signal QCLK. Thus, if signal RSR is received by latch ILA1, latch ILA1 stores a binary 1 at the rising edge of QCLK, whereas if a binary voltage of 1 volt is received by latch ILA1, latch ILA1 stores a binary 0 at the rising edge of signal QCKL.

It will be appreciated that the timing discussed above for CLBs 102 also applies to IOB latches ILA1*l* and OLA11, and the timing for the signals on IOB output leads OL11 and OL12.

It will also be appreciated that because signals QCLK and $\overline{\text{QCLKDEL}}$ are resonating signals, routing signals QCLK and $\overline{\text{QCLKDEL}}$ to CLBs 102 and IOBs 104 does not excessively add to the energy consumption of FPGA 100.

Embodiment Using Balanced Loading of the Resonant Circuit

It should be noted that balancing the capacitive loading on the outputs of the resonant oscillator circuits (i.e., the capacitive loading on wires 108 and 160 in FIGS. 10, 11 and 12) is not a requirement for using resonant drive circuitry. However, it is desirable to balance the capacitive loading on each side of the resonator in order to reduce clock jitter (in the presence of noise) and duty cycle distortion (in the presence of systematic offset). In one embodiment of the invention, balanced loading of resonating circuit 106 is achieved by providing resonating signal RSR to half of the CLBs and IOBs in the FPGA via wire 108 and providing signal $\overline{\text{RSR}}$ via a wire 160 to the other half of the CLBs and IOBs in the FPGA. The capacitance of the CLBs, IOBs and wires within interconnect wiring IW coupled to wire 160 balances the capacitance of the CLBs, IOBs, and wires within interconnect wiring IW coupled to wire 108.

Signal $\overline{\text{RSR}}$ resonates within the same voltage range as signal RSR, i.e. between 1 and 2 volts.) The CLBs in array 100 that receive signal $\overline{RSR}$ contain an output latch OLA21 and a pulse generator PG2, schematically illustrated in FIG. 16. Latch OLA21 controls a set of output switches OS21 and OS22 that drive output lead OL21 with signal $\overline{RSR}$ when the Q output signal of latch OLA21 is a binary 0 and with a 2 volt binary voltage when the Q output signal of latch OLA21 is a binary 1. Similarly, switches OS23 and OS24 drive output lead OL22 with signal $\overline{RSR}$ when signal $\overline{Q}$ is a binary 0 and a 2 volt binary voltage when signal $\overline{Q}$ is a binary 1. Thus, the CLBs that receive signal $\overline{RSR}$ function like the CLBs that receive signal $\overline{RSR}$, except that they apply signal RSR to communicate a binary 0, and a 2 volt binary signal to communicate a binary 1. Also, switches OS21 to OS24 change state only when resonating signal $\overline{RSR}$ is at its peak voltage (2 volts). In this way there are no discontinuities or switching losses when switches OS21 to OS24 change state.

Figure 16:
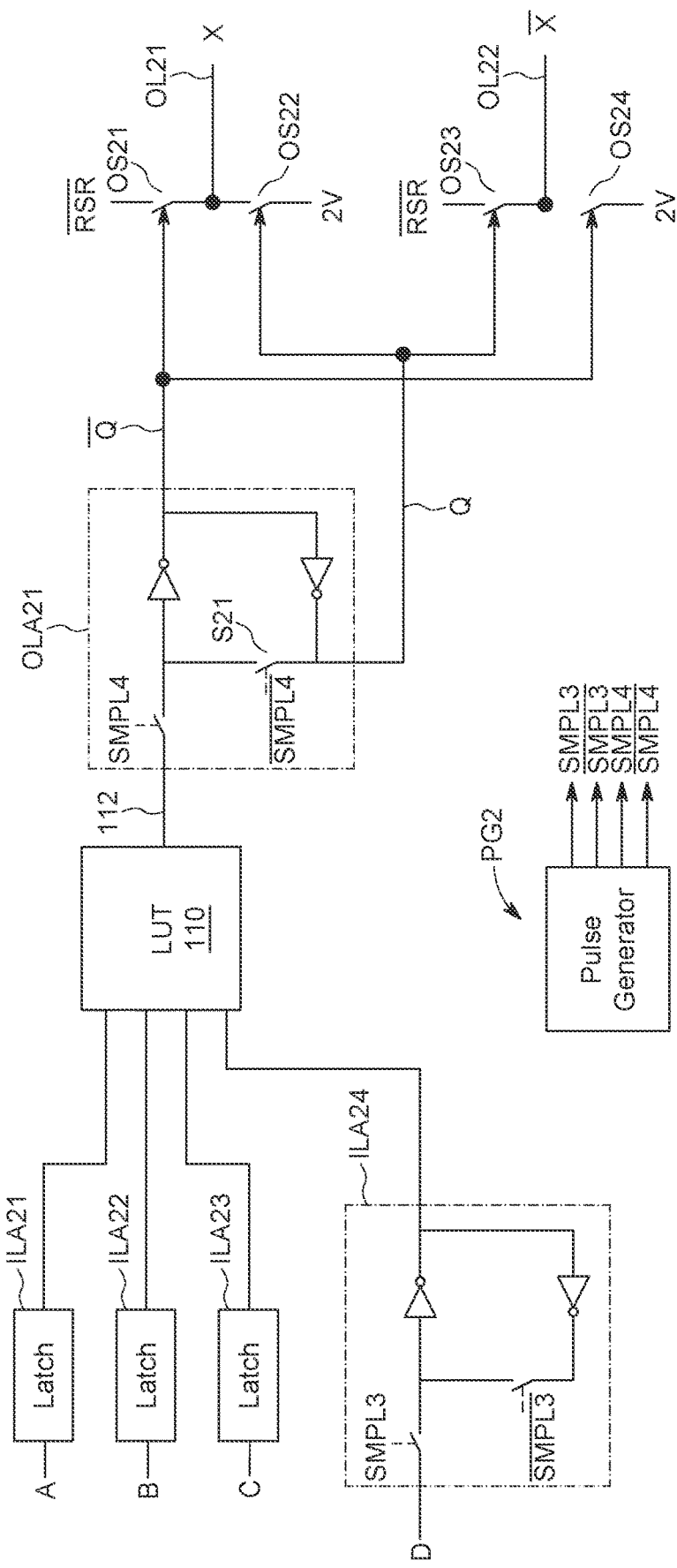
FIG. 16 illustrates an embodiment of a CLB that receives a resonating signal that is the inverse of the resonating signal received by the CLB of FIG. 8.

While FIG. 16 illustrates the logical relationship between signals Q, $\overline{Q}$, SMPL3 and $\overline{SMPL3}$ and switches OS21 to OS24, in one embodiment, switch OS22 can be a PMOS transistor with its gate driven by signal $\overline{Q}$ and switch OS24 can be a PMOS transistor with its gate driven by signal Q. Switches OS21 and OS23 are typically parallel-coupled NMOS and PMOS transistors.

The CLB of FIG. 16 includes a set of input latches ILA21 to ILA24 that latch input signals A to D preferably when signal $\overline{RSR}$ is at its minimum (i.e. signal RSR is at its maximum), or at most at a voltage interpreted by latches ILA21 to ILA24 as a binary 0. Thus, the timing for latches ILA21 to ILA24 is the same as the timing for latches ILA1 to ILA4 above. Pulse generator PG2 controls the timing for latches ILA21 to ILA24 by generating signals SPML3 and $\overline{SMPL3}$. Pulse generator PG2 controls the timing for output latch OLA21 by generating signals SMPL4 and $\overline{SMPL4}$.

Figure 14B:
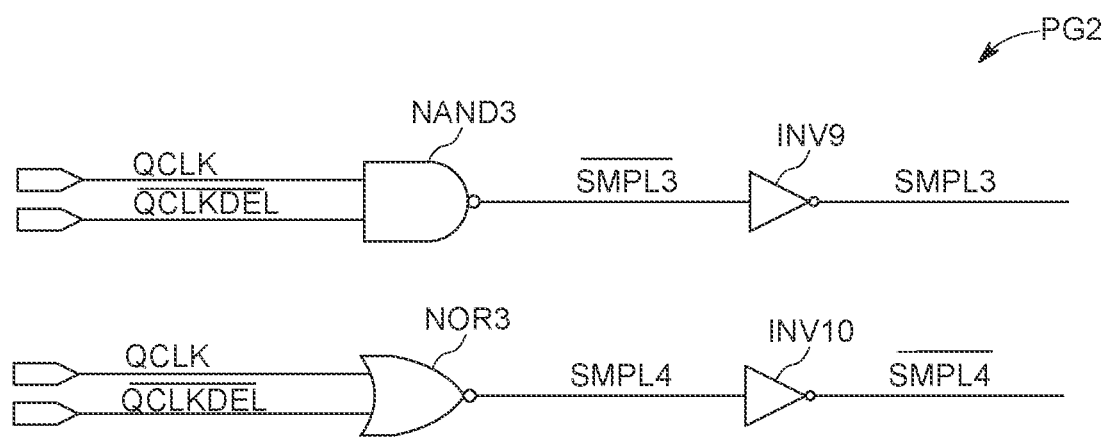
FIG. 14b illustrates a pulse generator for use in a CLB which receives a resonating signal that is the inverse of the resonating signal used by the CLB of FIG. 8.

FIG. 14b Illustrates an embodiment of pulse generator PG2. Pulse generator PG2 generates signals SMPL3 and $\overline{SMPL3}$ with a CMOS NAND gate NAND3 and an inverter INV9 in response to signals QCLK and $\overline{QCLKDEL}$. Similarly, pulse generator PG2 generates signals SMPL4 and $\overline{SMPL4}$ with a NOR gate NOR3 and an inverter INV10.

It will be appreciated that those IOBs that receive signal $\overline{RSR}$ operate in a manner analogous to the CLBs that receive signal $\overline{RSR}$ to communicate data to CLBs 102 via interconnect wiring IW. In other words, the IOBs that receive signal $\overline{RSR}$ apply signal $\overline{RSR}$ to their output leads to communicate a binary 0 and 2 volts to their output leads to communicate a binary 1. These IOBs change the state of their output signals only when signal $\overline{RSR}$ is at its maximum value (2 volts).

Figure 15B:
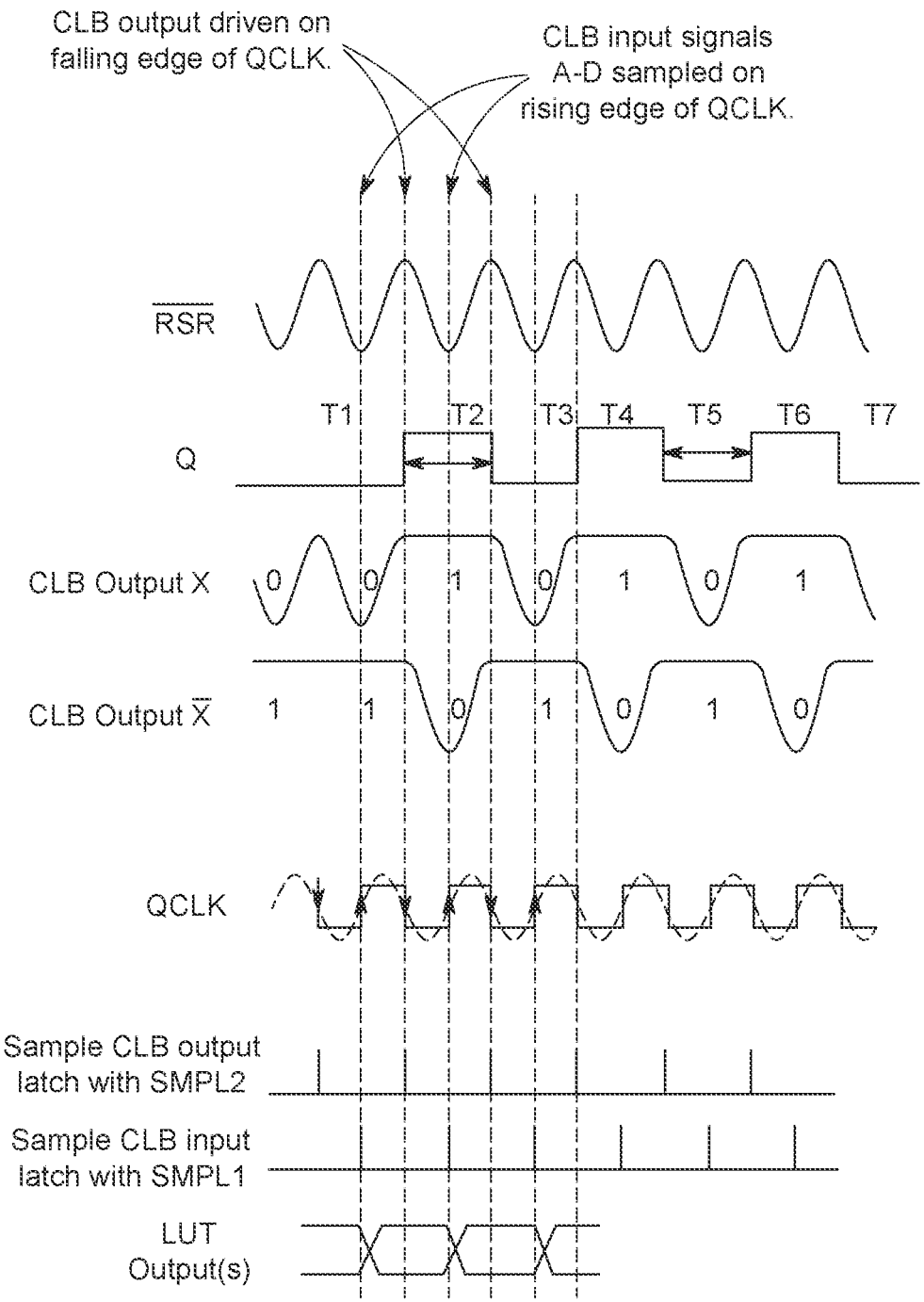
FIG. 15b is a timing diagram showing the relationship between various signals within a CLB that receives a resonating signal that is the inverse of the resonating signal used by the CLB of FIG. 8.

FIG. 15b is a timing diagram showing the relationship between signals $\overline{RSR}$, QCLK, CLB output signals X and $\overline{X}$, and the output signal from LUT 110 for the CLBs that receive signal RSR. As can be seen, the states of the output signals X and $\overline{X}$ on leads OL21 and OL22 only change when signal $\overline{RSR}$ is at its maximum which coincides with the falling edge of signal QCLK.

FIG. 15b also illustrates the relationship between the timing of signal $\overline{RSR}$ and the latching of the CLB input signals A, B, C and D. Again, the CLB input signals are latched when signal $\overline{RSR}$ is at its minimum, coinciding with the rising edge of signal QCLK. If signal A is signal $\overline{RSR}$ (corresponding to a binary 0), input latch IL31 stores signal $\overline{RSR}$ when signal $\overline{RSR}$ is at its minimum (e.g. the voltage corresponding to a binary 0). If signal B is a binary 1, input latch IL32 stores a binary 1. If signal C is the same as signal RSR (corresponding to a binary 1), input latch IL33 stores signal RSR at a time when signal $\overline{RSR}$ is at its minimum which is also when signal RSR is at its maximum (i.e. the voltage corresponding to a binary 1). If signal D is a binary 0, input latch IL34 stores a binary 0. In this way, the CLBs and IOBs latch and interpret signals from interconnect wires IW, which can be either a binary 1 voltage, a binary 0 voltage, signal RSR or signal $\overline{RSR}$.

It will be appreciated that the timing for the output signals on leads OL11 and OL12 of the IOBs that receive signal $\overline{RSR}$ from bus 160 (instead of receiving signal RSR from wire 108) is the same as the timing shown in FIG. 15b above). Also, the timing for the input latches of the IOBs that receive signal $\overline{RSR}$ is also the same as the CLBs that receive signal $\overline{RSR}$ (shown in FIG. 15b).

It will also be noted that the timing for input latches ILA1 to ILA4 and ILA1l for the CLBs and IOBs that receive signal RSR from bus 108 is the same as the timing for the input latches for the CLBs and IOBs that receive signal $\overline{RSR}$. Thus, the CLBs that receive signal RSR can latch and appropriately store signal $\overline{RSR}$ as a binary 0 and a binary voltage of 2 volts as a binary 1, as well as a binary voltage of 1 volt as a binary 0 and signal RSR as a binary 1.

Embodiment of CLB Capable of a Disabled Output

Figure 17:
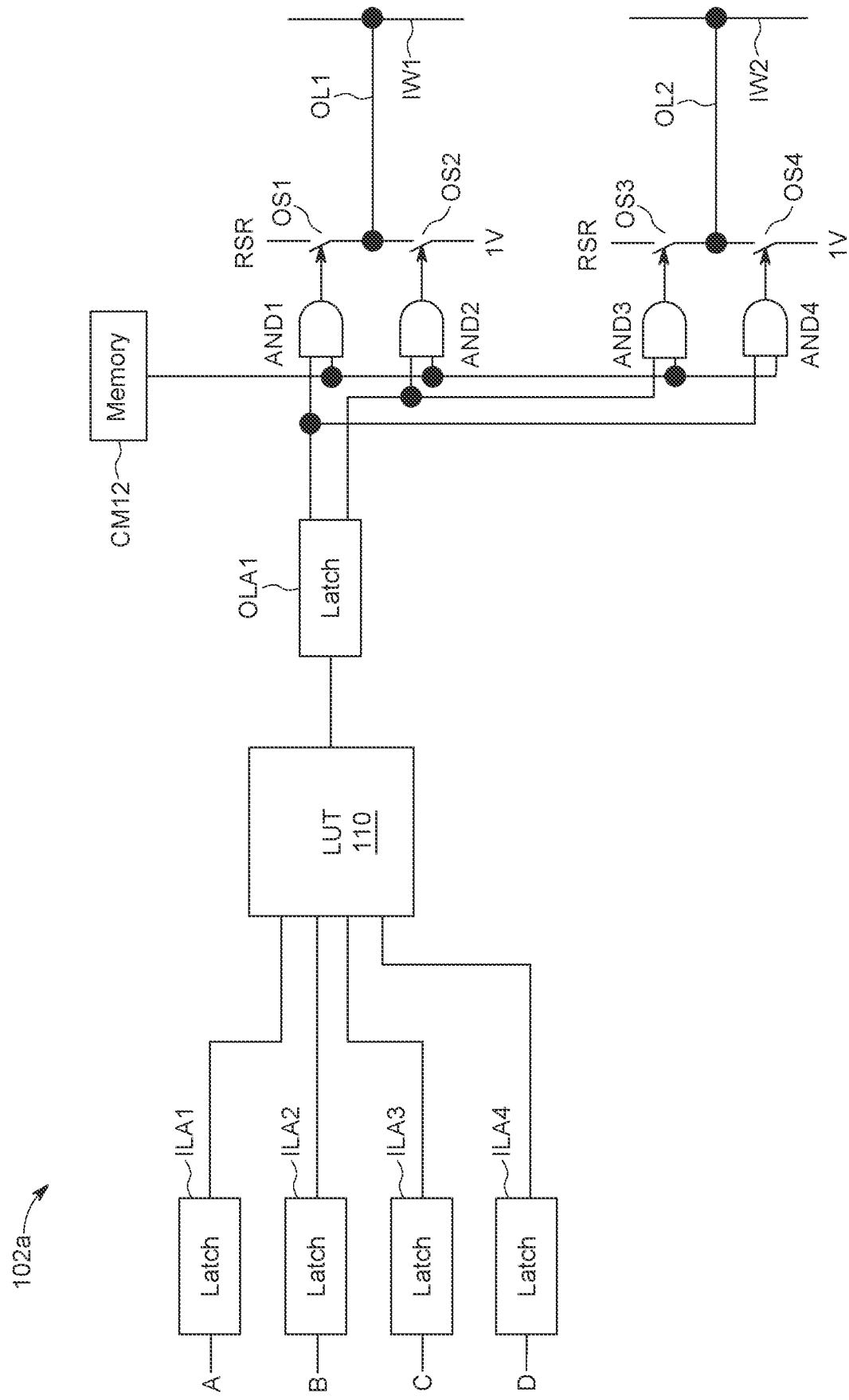
FIG. 17 illustrates a CLB that can have its output signals disabled.

FIG. 17 illustrates an embodiment of a CLB 102a in which latch OLA1 controls switches OS1 to OS4 via AND gates AND1 to AND4. Also driving AND gates AND1 to AND4 are configuration memory cells CM12 (typically loaded when configuration data is stored into the FPGA). And gates AND1 to AND4 can be used to keep switches OS1 to OS4 open so that output leads OL1 and OL2 are not driven by the CLB 102a. This can be done if the output signal from LUT 110 is not needed, and it is desired to have other CLBs driving the interconnect wiring segments IW1, IW2 which would otherwise be driven by CLB 102a.

Interconnect Wiring

Figure 18:
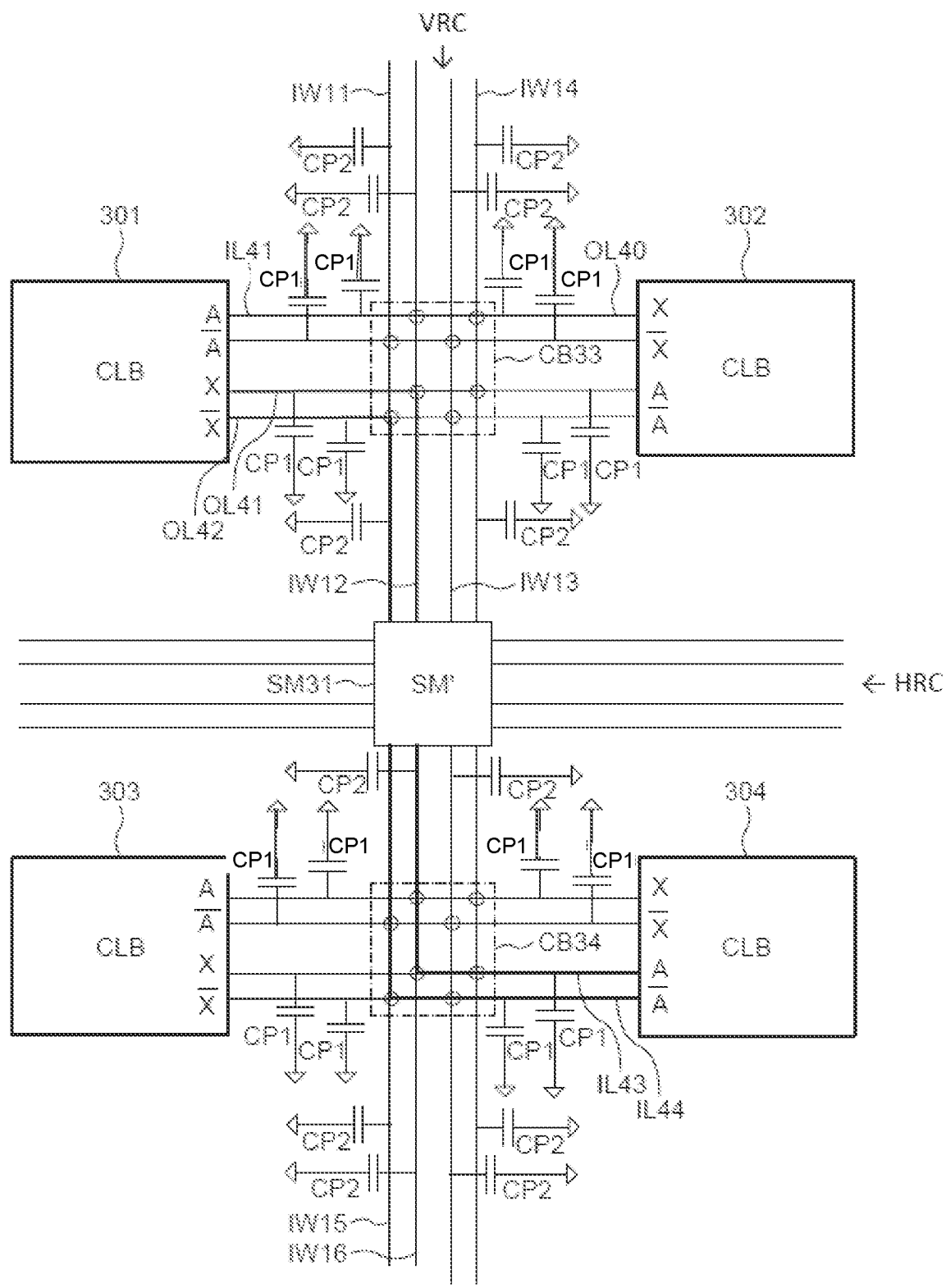
FIG. 18 illustrates a first type of interconnect wiring for use in an FPGA in accordance with the invention wherein complementary pairs of output signals are routed from a first CLB to a second CLB to achieve balanced capacitive loading.

FIG. 18 is a simplified block diagram of a portion of an FPGA illustrating one embodiment for ensuring that the load capacitance on resonant circuit 106 stays constant as the signals provided by the CLBs and IOBs change. As explained below, this is accomplished by ensuring that pairs of output leads, such as output leads OL41 and OL42 of CLB 301 are coupled through the same number of both horizontal and vertical interconnect wire segments, so that their sum total load capacitances are equal. FIG. 18 illustrates a set of CLBs 301 to 304. Only two of the CLB input leads, which receive the A and $\overline{A}$ input signals, are shown in FIG. 18, although it will be appreciated that CLBs typically receive more than two input signals. Only two of the CLB output leads, which provide signals X and $\overline{X}$ are shown in FIG. 18, although the CLBs can have more than two output leads. Also, although vertical and horizontal wiring channels VRC and HRC are shown as being four interconnect wires wide in FIG. 18, typically additional wires are present in channel VRC and HRC.

In the example of FIG. 18, output leads OL41 and OL42 of CLB 301 are coupled via connection block CB33, wire segments IW11 and IW12, switch matrix SM31, wire segments IW15 and IW16, and connection block CB34 to input leads IL43 and IL44 of CLB 304. The capacitance driven by lead OL41 equals CP1 (the capacitance of output lead OL41), plus CP2 (the capacitance of wire segment IW12 coupled to lead OL41 via connection block CB33) plus CP2 (the capacitance of wire segment IW15 coupled to wire segment IW12 via switch matrix SM31) plus capacitance CP1 (the capacitance of input lead IL43 coupled to wire segment IW15 via connection block CB34) for a total of 2×CP1+2×CP2. Similarly, the capacitance driven by lead OL42 equals CP1 (the capacitance of lead OL42) plus CP2 (the capacitance of wire segment IW12 coupled to lead OL42 via connection block CB33) plus capacitance CP2 (the capacitance of wire segment IW16 coupled to wire segment IW12 via switch matrix SM41) plus CP1 (the capacitance of input lead IL44 coupled to wire segment IW44 via connection block CP34) for a total of 2×CP1+2× CP2. As can be seen, by routing the X and $\overline{X}$ output signals of CLB 301 in pairs, one can ensure that the capacitive loading of leads OL41 and OL42 is equal. (Additional undriven "dummy" wires tied to a fixed supply voltage can be added to the routing channel to ensure that all wires have identical capacitive loading.)

As mentioned above, signal X is the logical inverse of signal $\overline{X}$. If signal X is signal RSR, signal $\overline{X}$ is a static voltage. If signal X is a static voltage, signal $\overline{X}$ is signal RSR. If the X and $\overline{X}$ output signals of CLB 301 change state (e.g. because the input signals of CLB 301 change state), and because the capacitances driven by output leads OL41 and OL42 are equal, CLB 301 will not cause the capacitive loading on resonating circuit 106 to change.

Figure 18A:
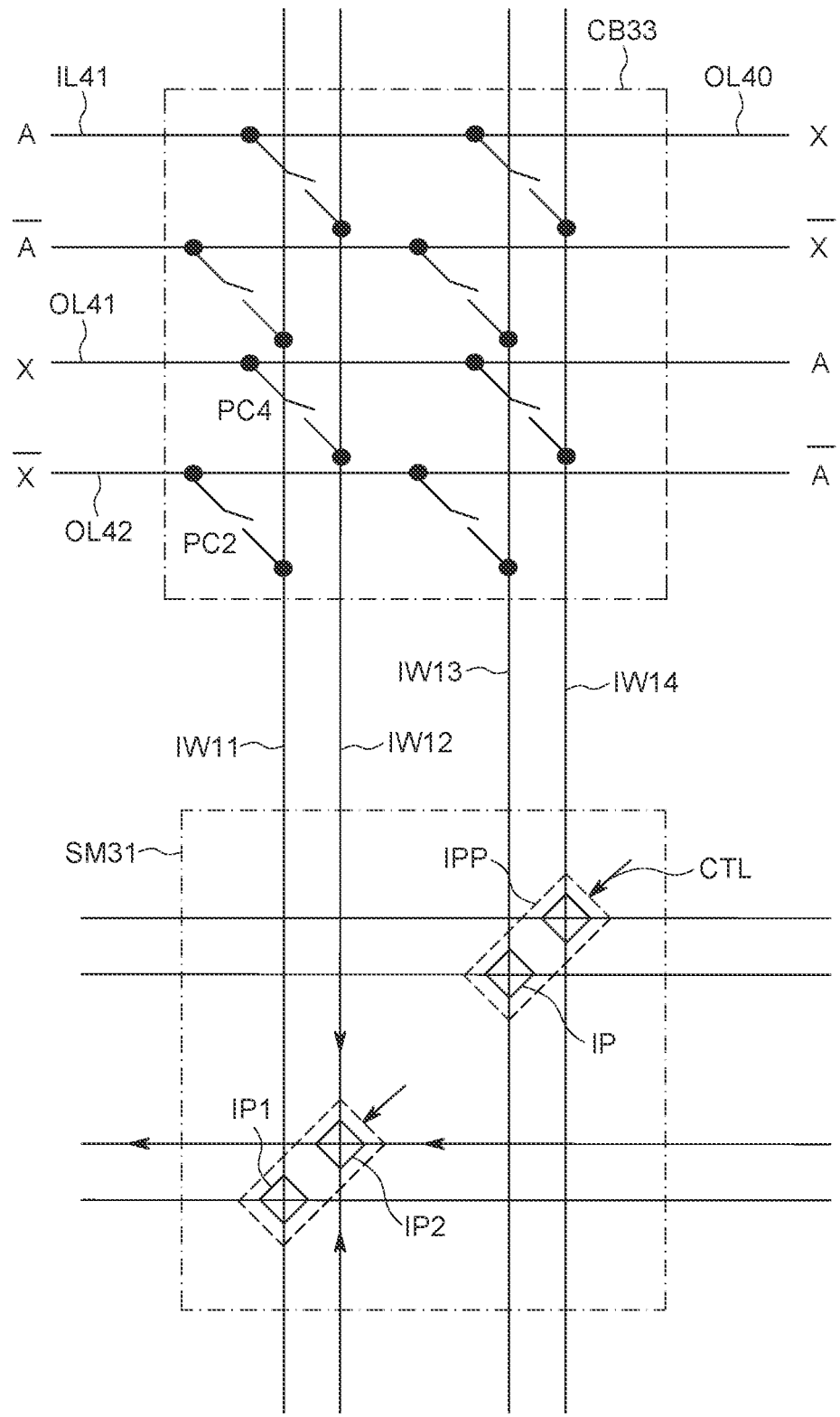
FIG. 18a illustrates connection block CB33 and switch matrix SM31 within the interconnect wiring of FIG. 18.

FIG. 18a illustrates in greater detail connection block CB33 and switch matrix SM31. As can be seen, output leads OL41 and OL42 are coupled to programmable connections PC2 and PC4, respectively. Because output signals X and $\overline{X}$ of CLB 301 are routed in parallel, only a single bit of configuration data is required to control programmable connections PC2 and PC4. Similarly, only a single set of configuration data bits are required to control interconnect points IP1 and IP2 in switch matrix SM31.

It will be appreciated that the switches that make up the interconnect points IP within the switch matrices and programmable connections PC of an FPGA in accordance with the invention typically comprise parallel-connected PMOS and NMOS transistors. This is done to prevent threshold voltage losses across the interconnect points.

In one embodiment, CLB 304 of FIG. 18 contains more than one LUT, and its input signals A and $\overline{A}$ drive different LUTs. Alternatively, signal A can drive a LUT within CLB 304, and signal $\overline{A}$ drives another structure within CLB 304. In yet another embodiment, CLB 304 can be configured to ignore signal $\overline{A}$. In such an embodiment, input lead IL44 of CLB 304 is coupled to lead OL42 of CLB 301 merely to ensure that the capacitive load on leads OL41 and OL42 are matched.

In the embodiment of FIG. 18, the A and $\overline{A}$ input leads of CLB 302 are hard wired to the X and $\overline{X}$ output leads of CLB 301. Similarly, the X and $\overline{X}$ output leads of CLB 302 are hard wired to the A and $\overline{A}$ input leads of CLB 301. (Note that the connection points within connection block CB33 have a structure as shown in FIG. 18a.) However, in other embodiments, there is a programmable switch between leads carrying signals A, $\overline{A}$, X and $\overline{X}$ of CLB 301 and the leads carrying signals X, $\overline{X}$, A and $\overline{A}$ of CLB 302. In yet another embodiment, there is a hard break between these leads, for example, lead OL41 and lead IL41 and the other output and input leads of CLBs 301 and 302. In yet another embodiment, the outputs X, $\overline{X}$ of CLB 301 are connected to the outputs X and $\overline{X}$ of CLB 302 whereby one set of outputs would always remain in a high-impedance state unless both CLBs are configured with identical logic and identical input signals. The inputs can also be hardwired together between CLB 301 and CLB 302.

Figure 19:
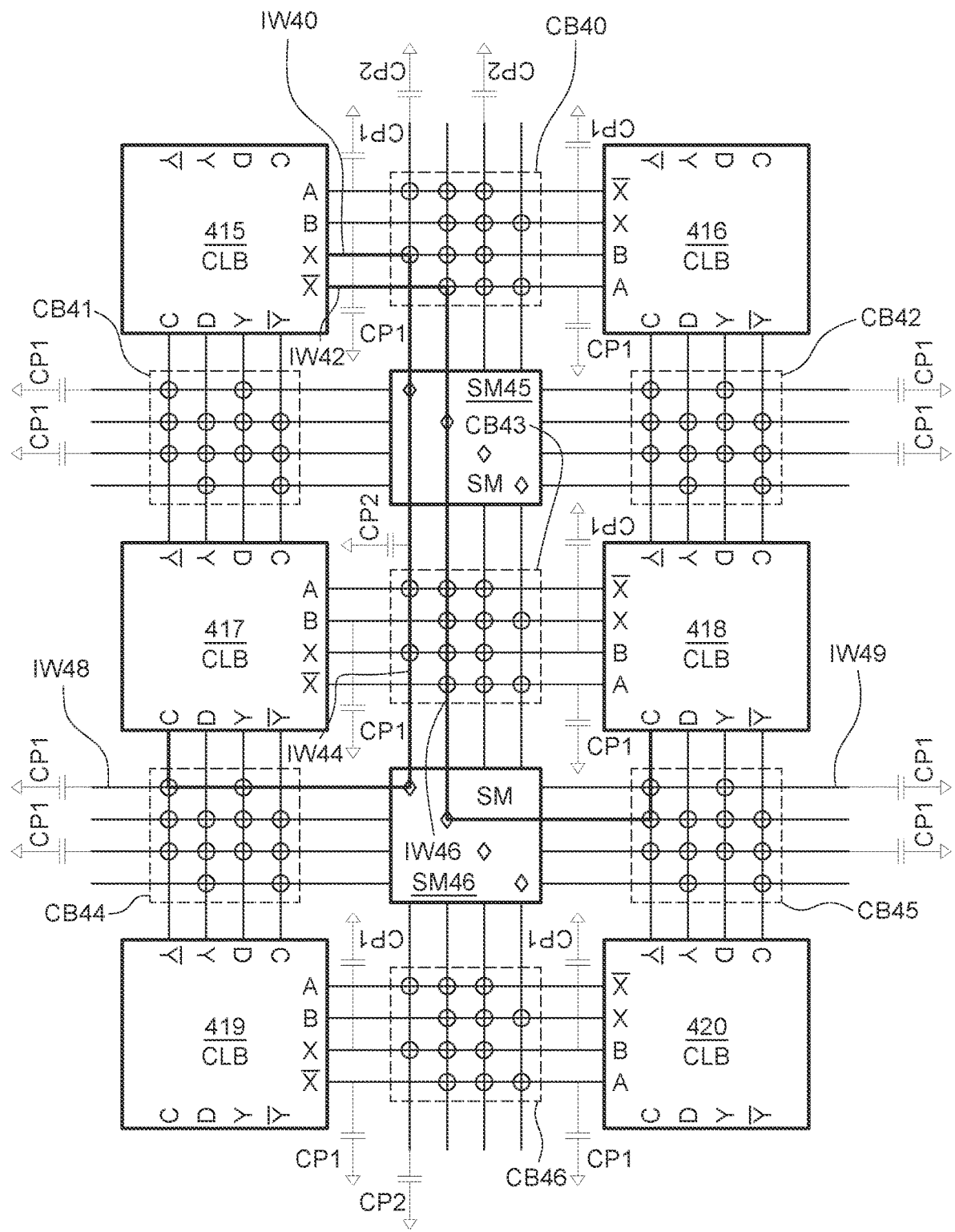
FIG. 19 illustrates a second type of interconnect wiring for use in an FPGA in accordance with the invention wherein complementary pairs of output signals follow along different paths to achieve balanced capacitive loading.

FIG. 19 shows an alternative routing configuration. The input and output leads of the CLBs in FIG. 19 are not connected as "signal pairs". In one programmed example, the X output signal of CLB 415 is connected to interconnect wiring segment IW40. Each of the separate horizontal and vertical wiring segments shown in FIG. 19 have capacitive loading CP1 and CP2 respectively. In this example, output signals X and $\overline{X}$ of CLB 415 are connected via interconnect wire segments IW40 and IW42 through connection box CB40 and switch matrix SM45 to interconnect wire segments IW44 and IW46, respectively, which in turn are connected via switch matrix SM46 to interconnect wire segments IW48 and IW49. Interconnect wire segment IW48 provides input signal C of CLB 417, while interconnect wire segment IW49 provides input signal D of CLB 418. The capacitive loading of each horizontal segment IW40, IW42, IW48 and IW49 is equal, i.e. capacitance CP1, and the capacitive loading of each vertical segment IW44, IW46, is also equal, i.e. capacitance CP2. Thus, the capacitive loading on the output leads of CLB 415 that provide the X and $\overline{X}$ are equal, i.e. a value of 2 times CP1 plus a value of 2 times CP2. Because of this, as output signals X and $\overline{X}$ change states, and signal RSR is switched from one output lead of CLB 415 to the other output lead of CLB 415, there is no change to the capacitive loading of resonant circuit 106 caused by CLB 415 changing state.

If signal $\overline{X}$ is not used, one can still route the $\overline{X}$ output signal of CLB 415 to an appropriate number of interconnect wiring segments to ensure that the capacitive coupling on the $\overline{X}$ lead balances the capacitive load on the X output lead.

It should also be noted that if an output lead providing signal X of a CLB is connected to another CLB via interconnect wiring just to balance the capacitive load on the lead that provides signal $\overline{X}$, a CLB receiving signal X can be programmed to ignore that signal.

In the example set forth above, the X and $\overline{X}$ signals of CLB 415 are routed through interconnect wires IW44 and IW46, respectively. In this example, the Y signals from CLB 419 and 420 are disabled by AND gates AND1 to AND4 of CLB 417 as described with reference to FIG. 17.

It is also noted in FIG. 19 that CLBs 415 to 420 have a second pair of output leads for providing signals Y and $\overline{Y}$. In this embodiment, CLBs 415 to 420 contain two LUTs and two pairs of output latches for providing a total of four output signals X, $\overline{X}$, Y and $\overline{Y}$.

Figure 20:
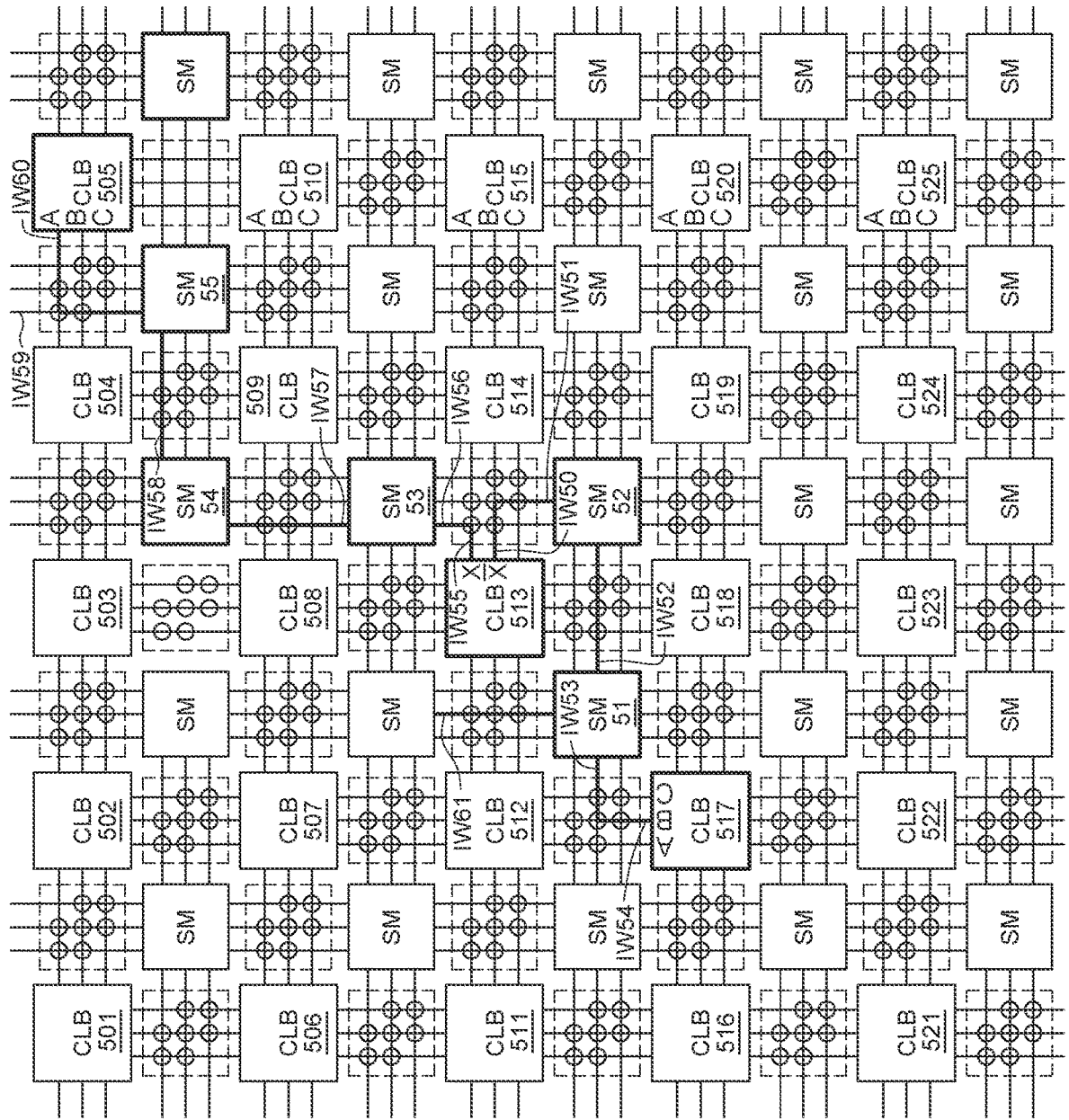
FIG. 20 illustrates a third type of interconnect wiring for use in an FPGA in accordance with the invention wherein complementary output signals from a CLB are routed to different locations within the FPGA to achieve balanced capacitive loading.

FIG. 20 shows another routing configuration that exhibits balanced capacitive loading. In FIG. 20, output signal $\overline{X}$ of CLB 513 is routed via switch matrices SM51 and SM52 and interconnect wire segments IW50, IW51, IW52, IW53 and IW54 to an input lead of CLB 517, while the X output signal of CLB 513 is routed via switch matrices SM53, SM54 and SM55 and interconnect wire segments IW55, IW56, IW57, IW58, IW59 and IW60 to an input lead of CLB 505. In order to balance the X and $\overline{X}$ capacitive loading of CLB 513, signal $\overline{X}$ of CLB 513 is also routed to interconnect wiring segment IW61 to couple the capacitive load of segment IW61 to the lead carrying the $\overline{X}$ output signal of CLB 513.

Figure 26:
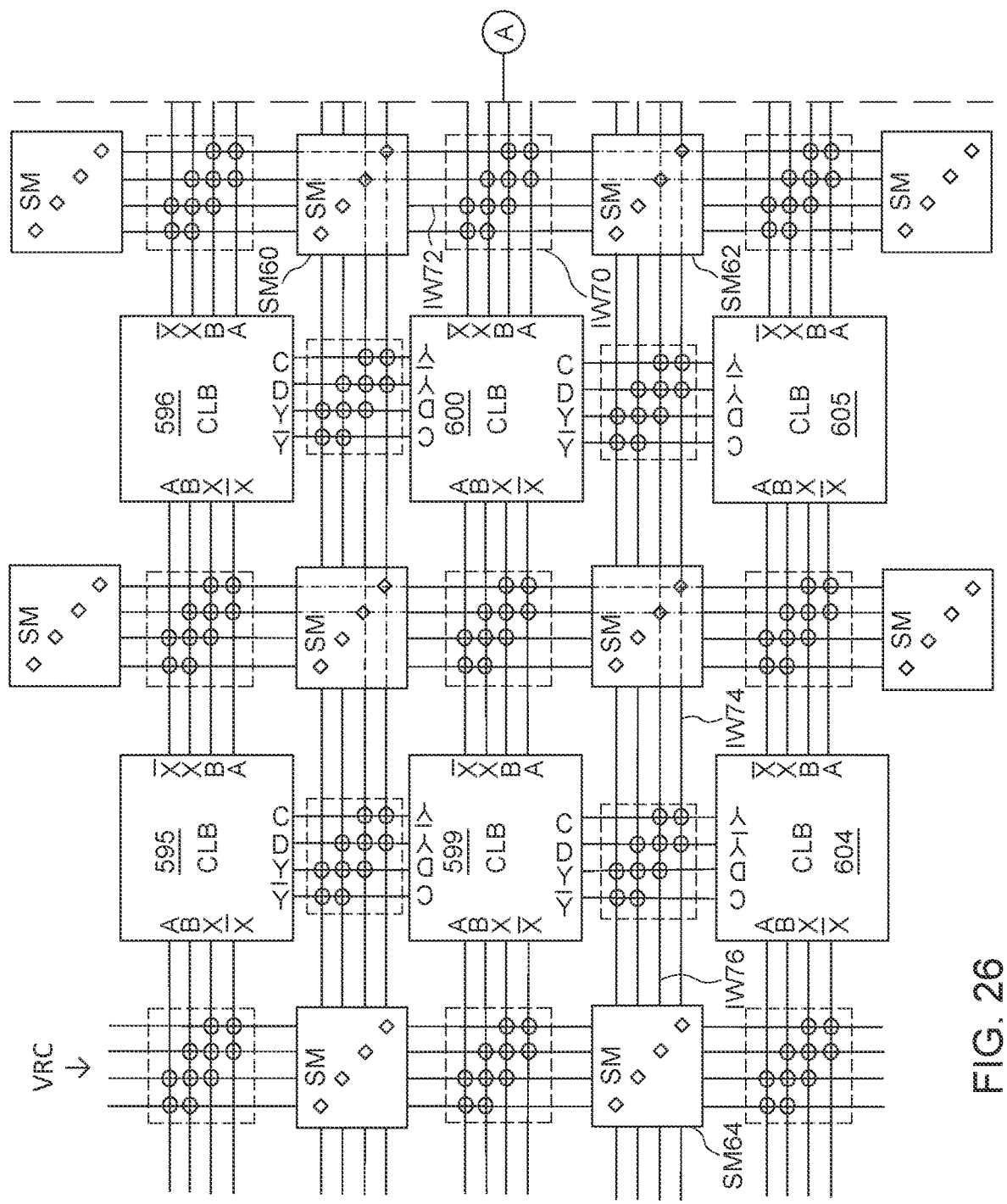
FIG. 26 is a block diagram illustrating interconnect wiring with long traces.
Figure 26:
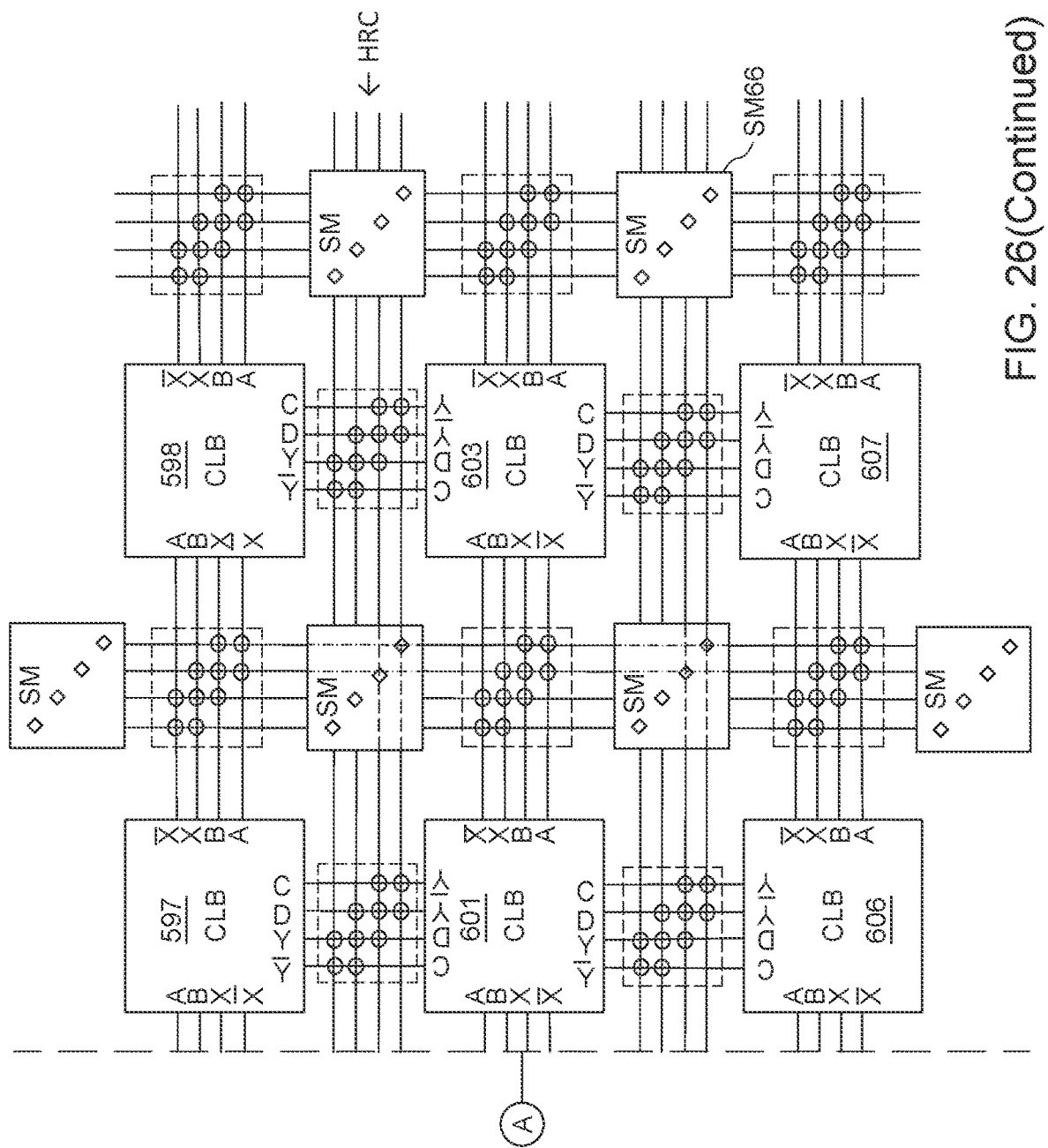
Figure 26A:
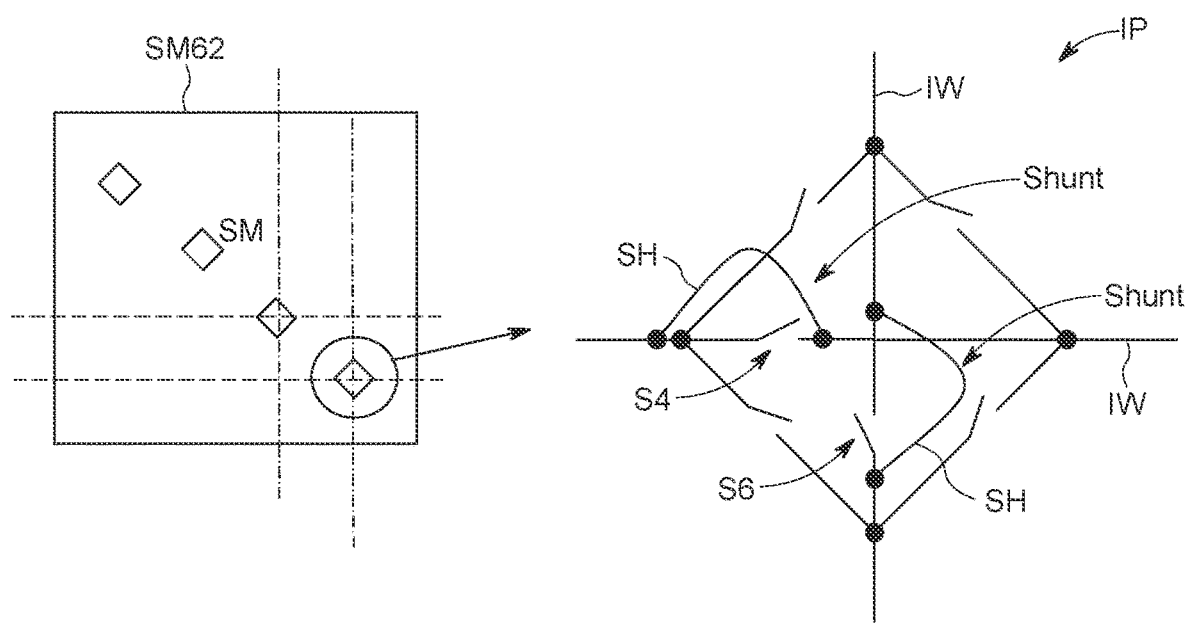
FIG. 26a illustrates a switch matrix within the block diagram of FIG. 26 indicting showing the manner in which it accommodates long traces.

FIG. 26 illustrates another embodiment of interconnect wires IW. As can be seen, some of the interconnect wiring segments, e.g., segment IW70 and IW72 extend only the width of one CLB (i.e., CLB 600). Wiring segments IW70 and IW72 terminate at interconnect points within switch matrices SM60 and SM62. Wiring segments IW74 and IW76 extend the width of four CLBs and terminate at interconnect points within switch matrices SM64 and SM66. (As can be seen in FIG. 26a, switch matrix SM62 permits wire segments IW74 and IW76 to pass therethrough without being interrupted by a switch interconnect point due to a pair of shunts SH across switches S4 and S6. Switches S4 and S6 within matrix SM62 serve as dummy capacitive loads to provide capacitance matching with the other switch matrices. It will be appreciated that in other embodiments interconnect wires IW can include segments that extend the width or length of two, four, or other widths and lengths of CLBs, and can also include segments that span the entire length or width of the FPGA.

Also, as mentioned above, horizontal and vertical routing channels HRC, VRC are typically more than four interconnect wires wide, and can be 10, 20, 30, 40 or other numbers of interconnect wires wide, typically depending upon the number of CLBs and IOBs in the array and depending upon the number of input leads and output leads per CLB and per JOB.

Embodiment of a CLB using Resonating Signal RSR within a LUT

Figure 1:
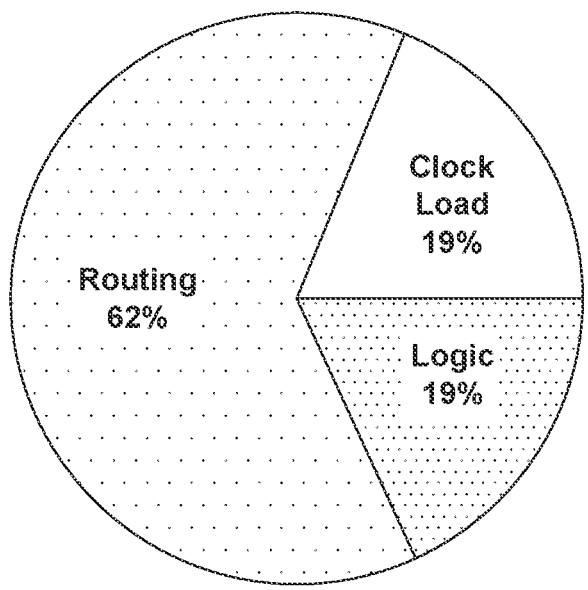
FIG. 1 is a pie chart showing the contributions of FPGA dynamic power in typical prior art FPGAs.
Figure 2A:
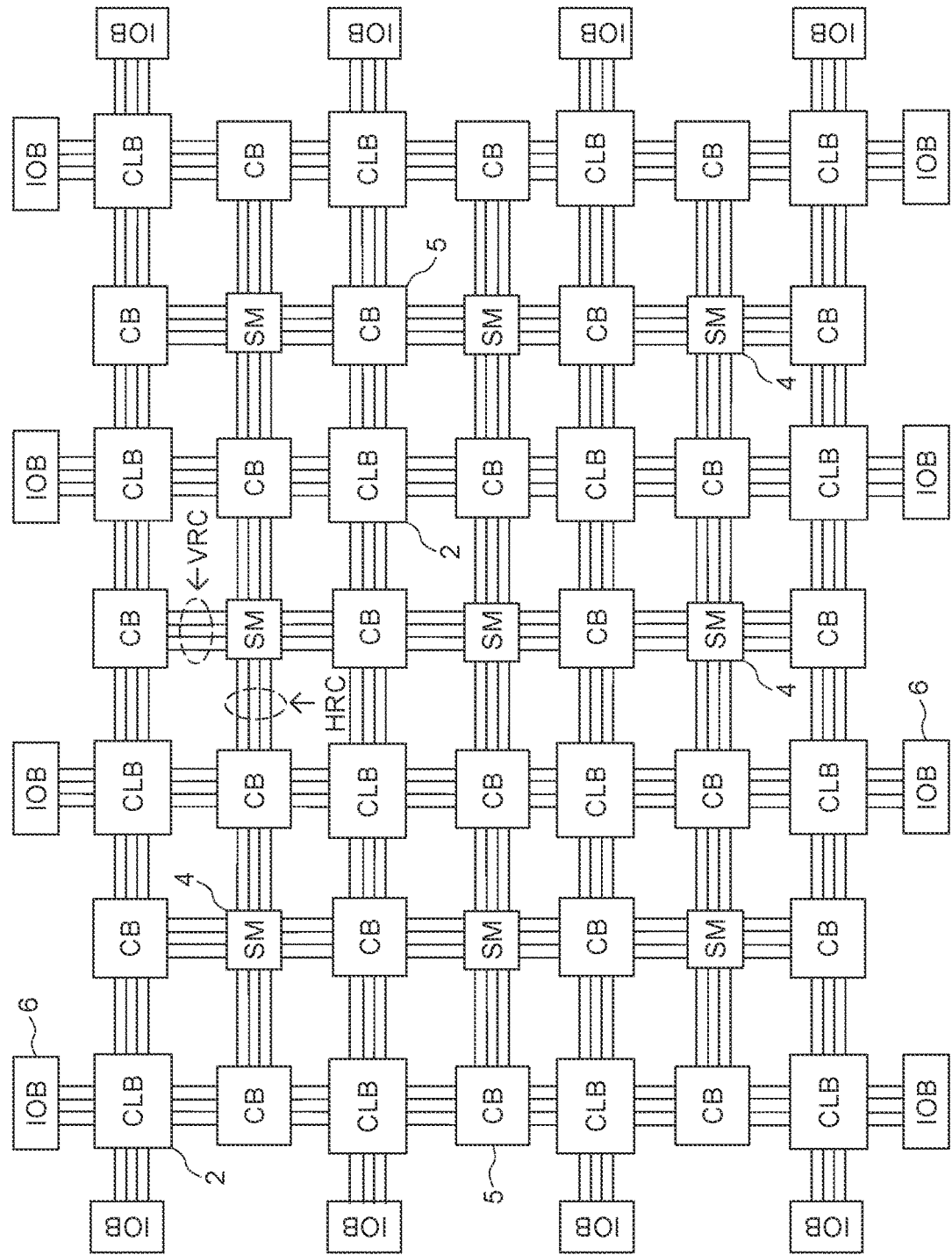
FIG. 2a illustrates an example of a FPGA architecture showing CLBs, CBs, SMs, IOBs and interconnect wiring.
Figure 2B:
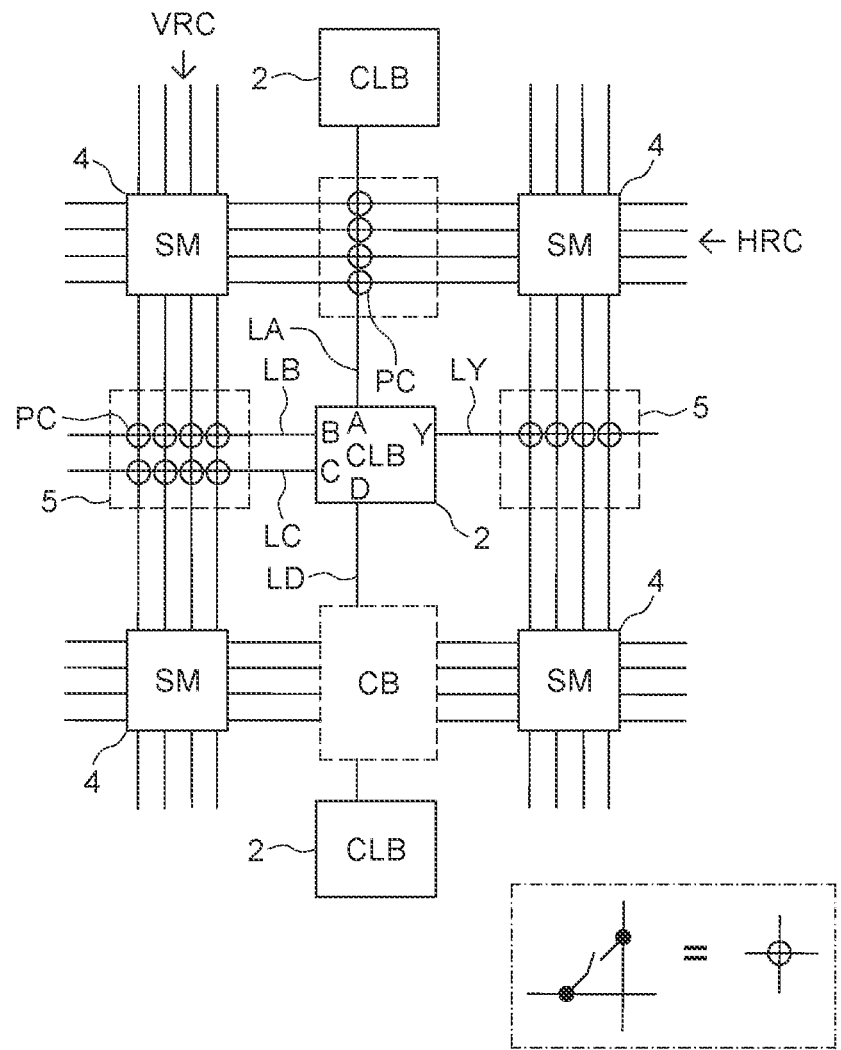
FIGS. 2b and 2c illustrate the manner in which a CLB is programmably coupled to the interconnect wiring.
Figure 2C:
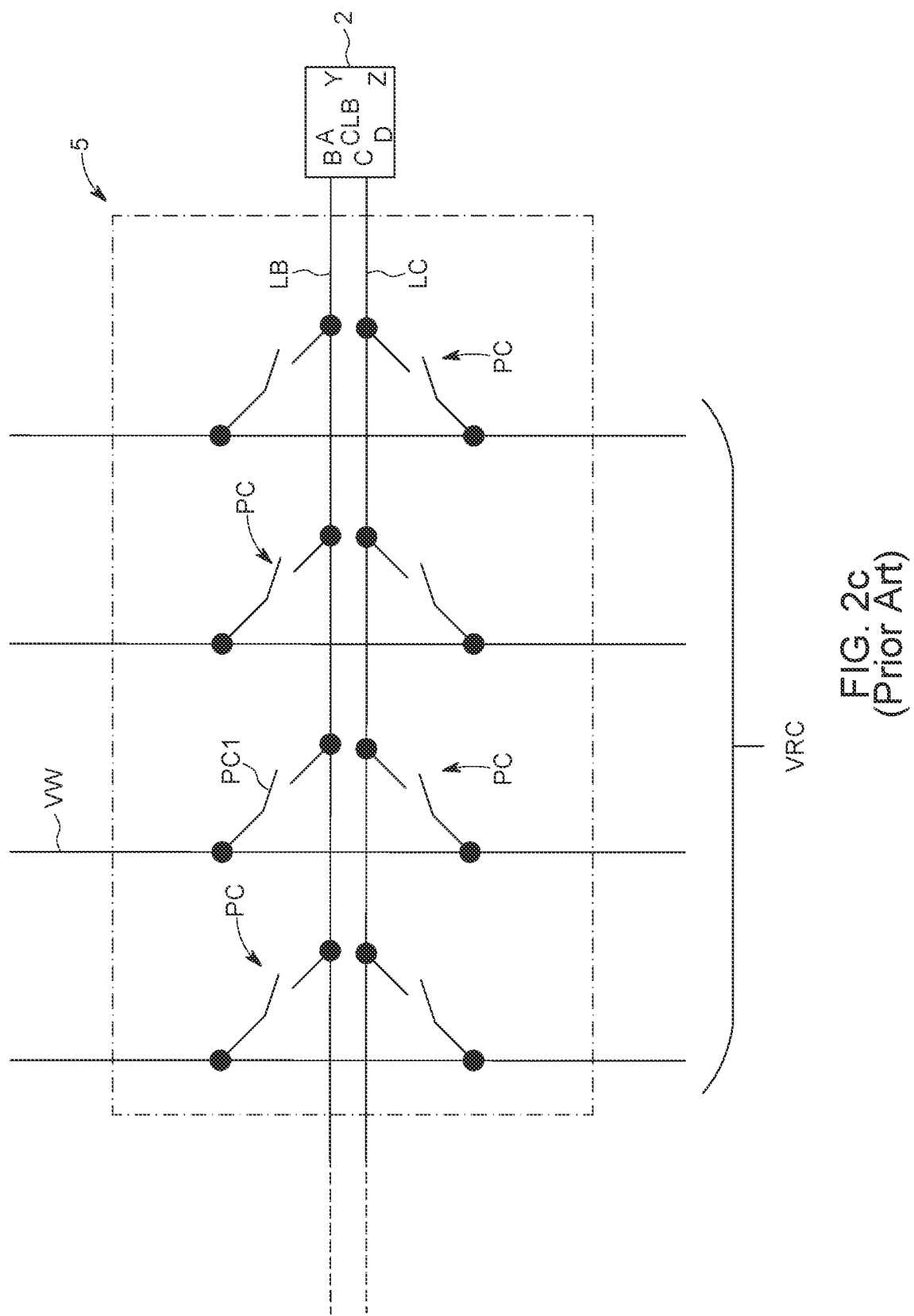
Figure 3:
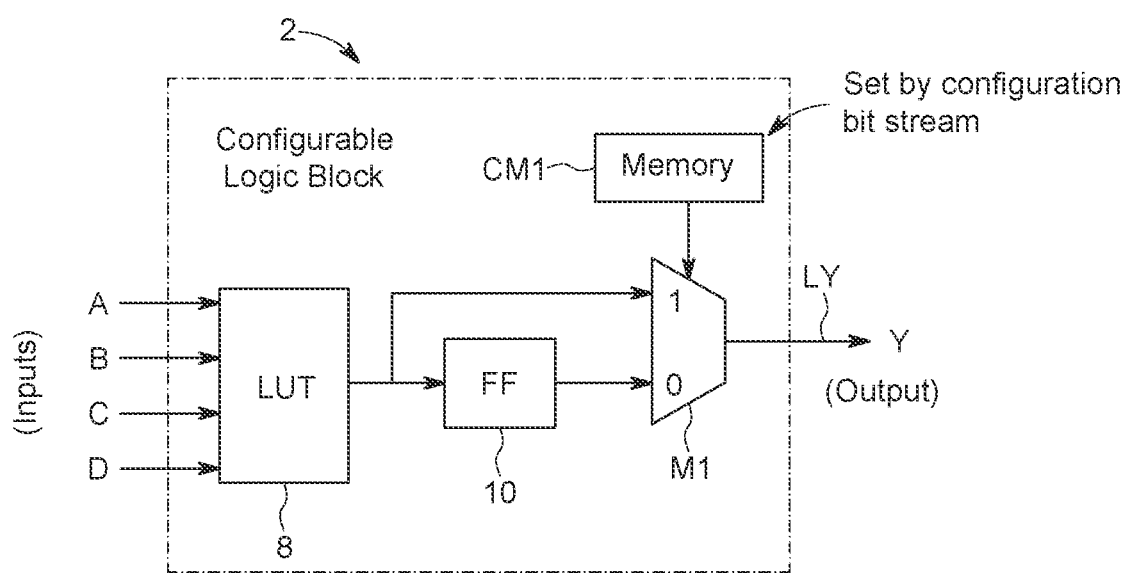
FIG. 3 is a simplified block diagram of a CLB within an FPGA.
Figure 4:
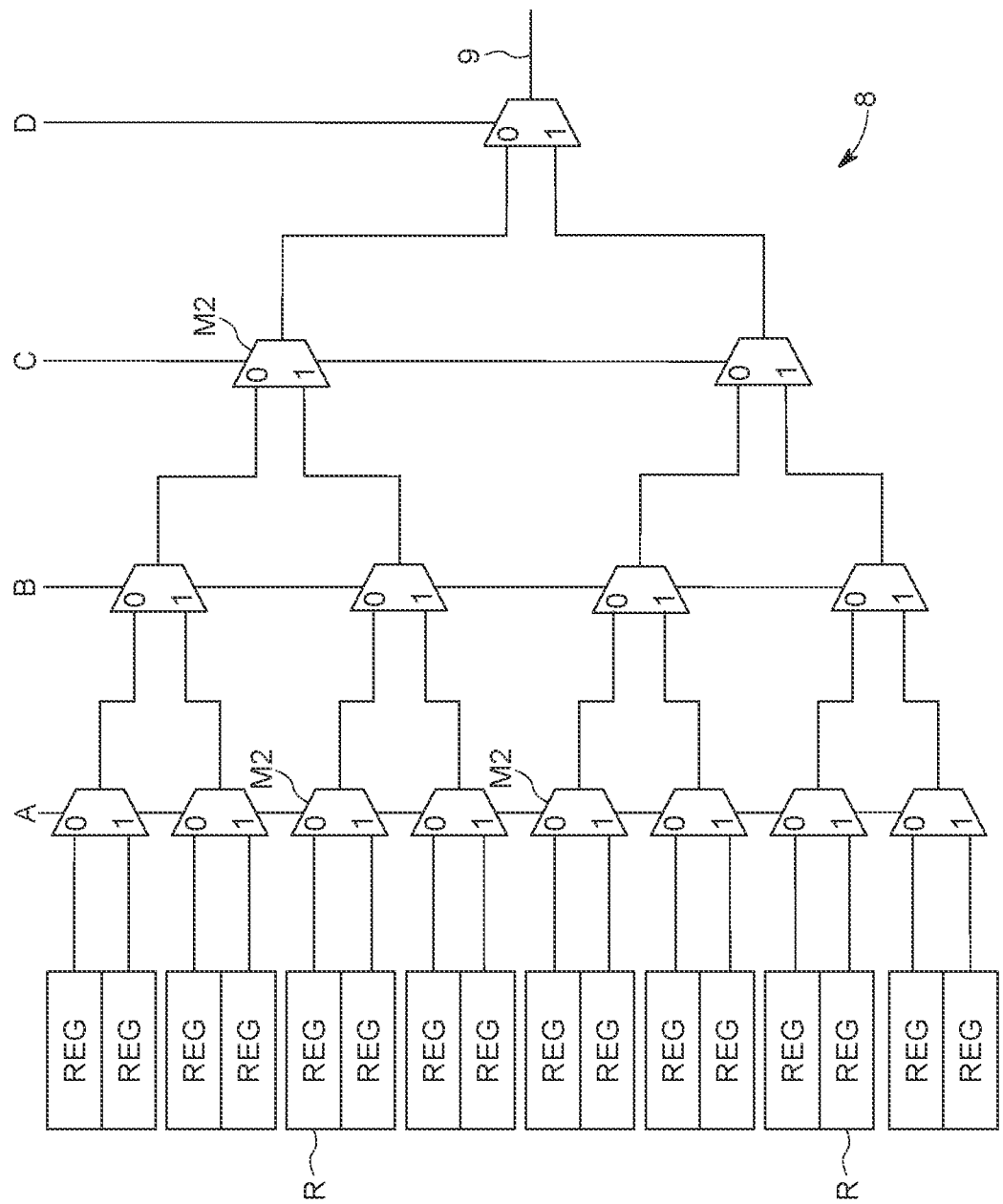
FIG. 4 illustrates a prior art LUT.
Figure 5A:
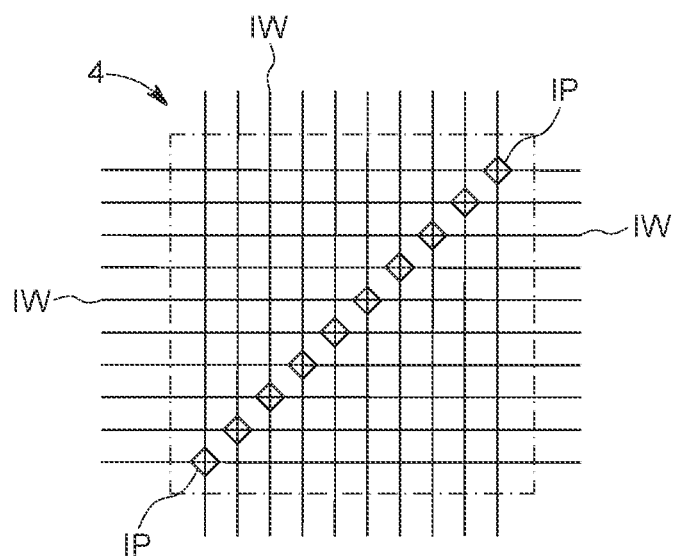
FIGS. 5a and 5b illustrate an example of a switch matrix within an FPGA and a switch interconnect point within the switch matrix.
Figure 5B:
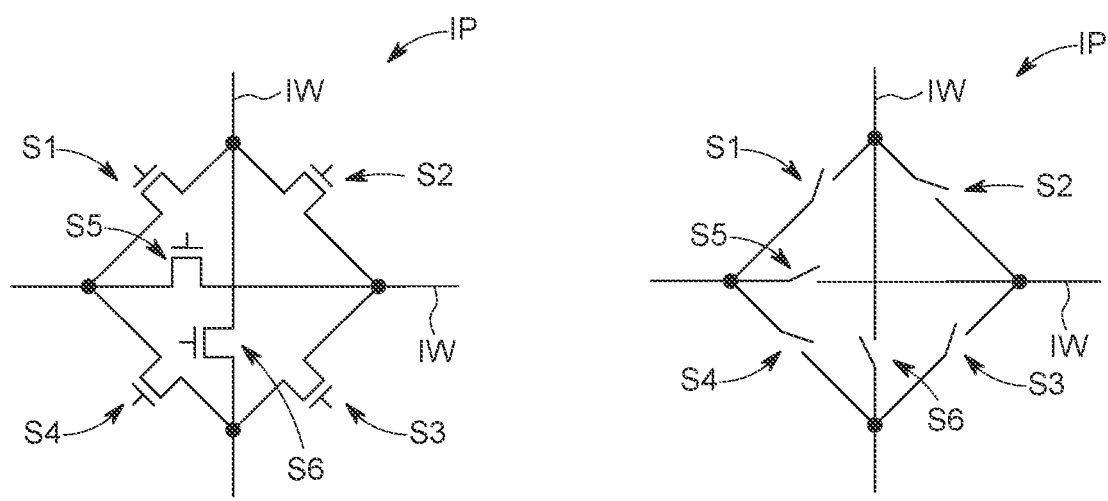
Figure 6:
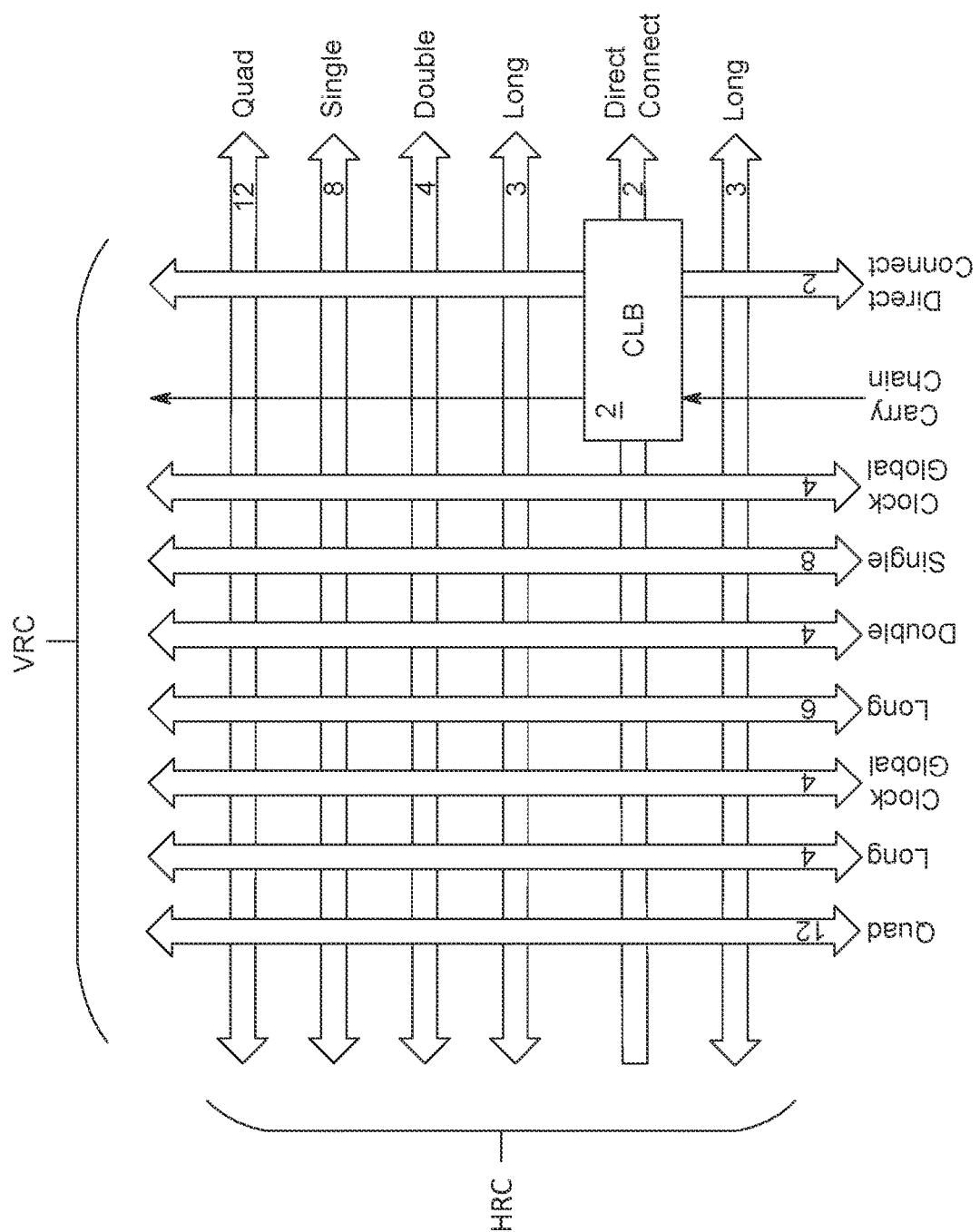
FIG. 6 illustrates an example of the horizontal and vertical wire routing between the CLBs.
Figure 27:
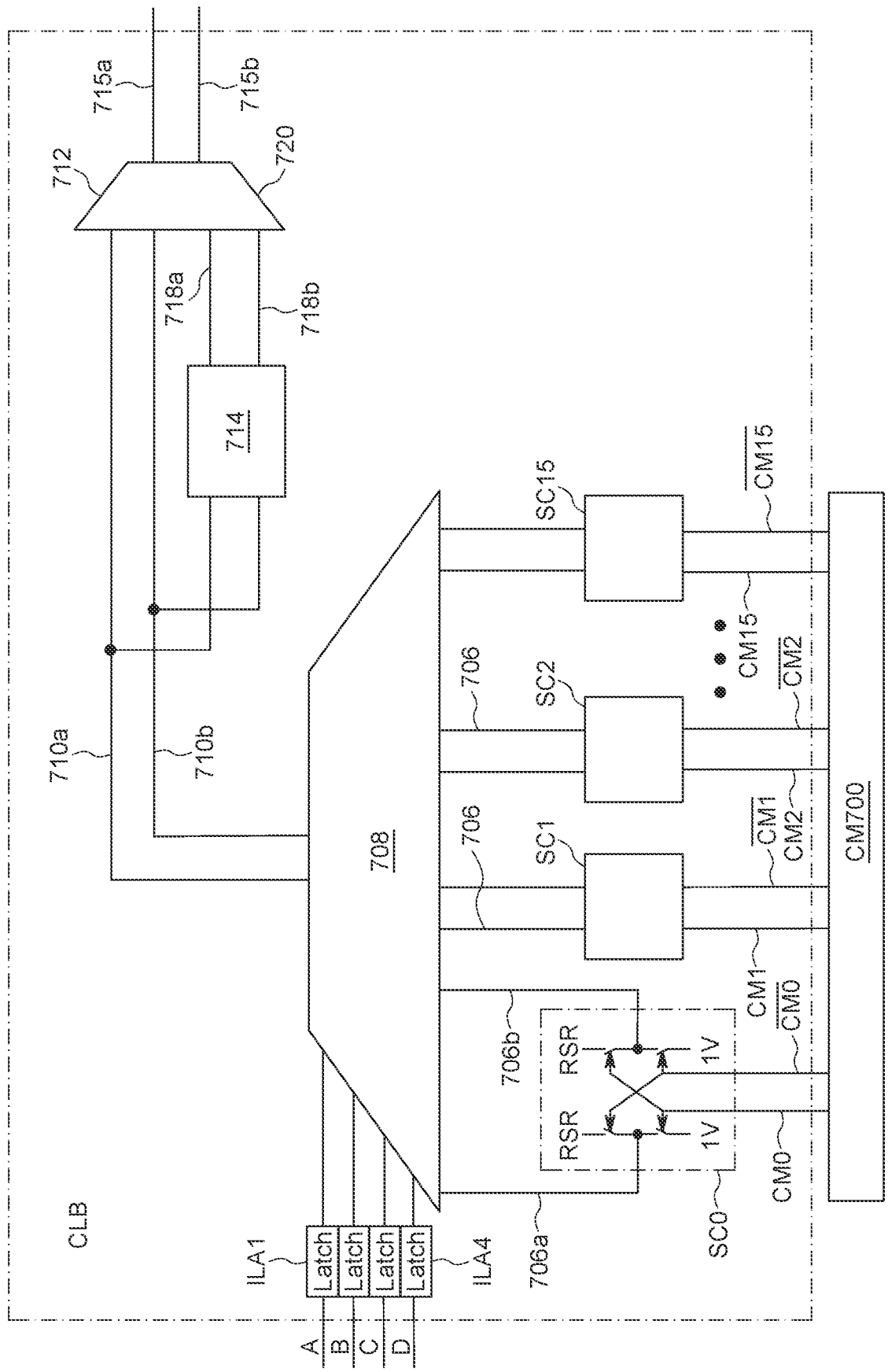
FIG. 27 illustrates another embodiment of a CLB in accordance with the invention.

FIG. 27 illustrates a CLB 700 in accordance with another embodiment of the invention. As explained below, unlike the CLB in FIGS. 3 and 4, CLB 700 uses resonating signal RSR internal to the CLB to further reduce power dissipation. CLB 700 comprises a LUT 702 that receives input signals A, B, C, and D from latches ILA1 to ILA4. CLB 700 receives sixteen bits of configuration data CM0 to CM15 from configuration memory CM700. However, unlike the LUT of FIG. 4, configuration data bits CM0 to CM15 drive a set of 16 switching circuits SC0 to SC15, which apply either signal RSR or a binary voltage to their output leads. For example, switching circuit SC0 couples signal RSR to output lead 706*a* and a binary voltage to output lead 706*b* if configuration data bit CM0 is a binary 1. Conversely, switching circuit SC0 couples signal RSR to output lead 706*b* and a binary voltage to output lead 706*a* if configuration data bit CM0 is a binary 0.

Output leads 706 of switching circuits SC0 to SC15 are coupled to a LUT multiplexer 708. Depending on the input signals received from input latches ILA0 to ILA3, LUT multiplexer 708 provides on its output leads 710*a*, 710*b* the output signals from a selected one of switching circuits SC0 to SC15. Suppose input signals A to D cause LUT multiplexer 708 to select multiplexer switching circuit SC0. In that case, the signal from output leads 706*a*, 706*b* of switching circuit SC0 are passed to LUT multiplexer output leads 710*a*, 710*b*, respectively. If configuration data bit CM0 is a binary 1, output leads 710*a* and 710*b* provide signal RSR and the binary voltage respectively. If configuration data bit CM0 is a binary 0, output leads 710*a*, 710*b* communicate the binary voltage and signal RSR, respectively. In this way, LUT multiplexer 708 provides binary output data corresponding to a logic function that is programmed using configuration data bits CM0 to CM15.

CLB 700 has the capability of providing registered or non-registered output signals to interconnect wiring IW. This is accomplished by coupling output leads 710*a*, 710*b* to an output multiplexer 712 and a memory 714. Memory 714 stores the signal on leads 710*a*, 710*b* in response to signals SMPL4, $\overline{\text{SMPL4}}$. (Signals SMPL4, $\overline{\text{SMPL4}}$ are generated in a manner similar to signals SMPL1 to SMPL3 and $\overline{\text{SMPL1}}$ to $\overline{\text{SMPL3}}$ discussed above.) Multiplexer 712 provides on its output leads 715*a*, 715*b* either the output signals on leads 710*a*, 710*b* directly from LUT multiplexer 708, or the signals from leads 718*a*, 718*b* from memory 714, depending on a select signal 720. (In different embodiments, signal 720 can be a bit in the FPGA configuration memory or a signal provided by another CLB in the FPGA.)

Figure 27A:
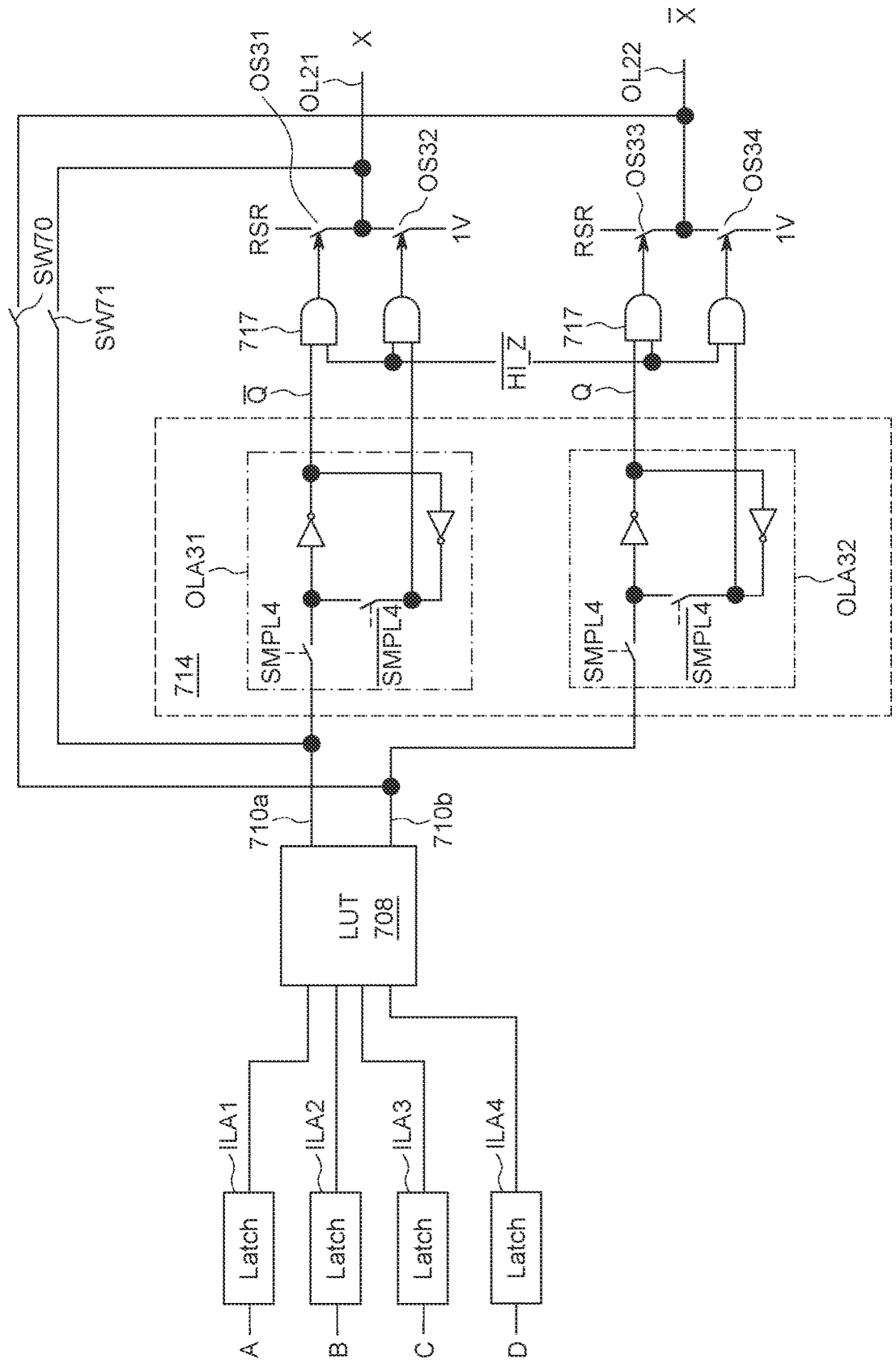
FIG. 27a illustrates a memory circuit within the CLB of FIG. 27 and an alternate embodiment for providing latched or non-latched output signals.

FIG. 27*a* illustrates an alternate embodiment of a circuit that provides the functionality of memory 714 and multiplexer 712. As illustrated in FIG. 27*a*, memory 714 comprises a pair of latches OLA31, OLA32, which in turn provide control signals via AND gates 717 to switches OS31 to OS34. (Latches OLA31 and OLA32 operate in the same manner as output latch OLA1 discussed above. Similarly, AND gates 717 and switches OS31 to OS34 function in the same manner as AND gates AND1 to AND4 and switches OS1 to OS4 described above in reference to FIG. 17. In this embodiment, either switches SW70, SW71 will be closed to enable LUT 708 to drive output leads 715*a*, 715*b* (in which case signal $\overline{\text{HI\_Z}}$ is asserted low to keep switches OS31 to OS34 open), or switches SW70 and SW71 are open and signal $\overline{\text{HI\_Z}}$ is high, memory 714 to control output leads 715*a*, 715*b* via switches OS31 to OS34 to drive output leads 715*a*, 715*b*. (Switches SW70, SW71 and signal $\overline{\text{HI\_Z}}$ are typically controlled by configuration data.) In this way, either LUT 708 or memory 714 drive output leads 715*a*, 715*b*.

Embodiment Using Fracturable Look-Up Tables in a CLB

Figure 28:
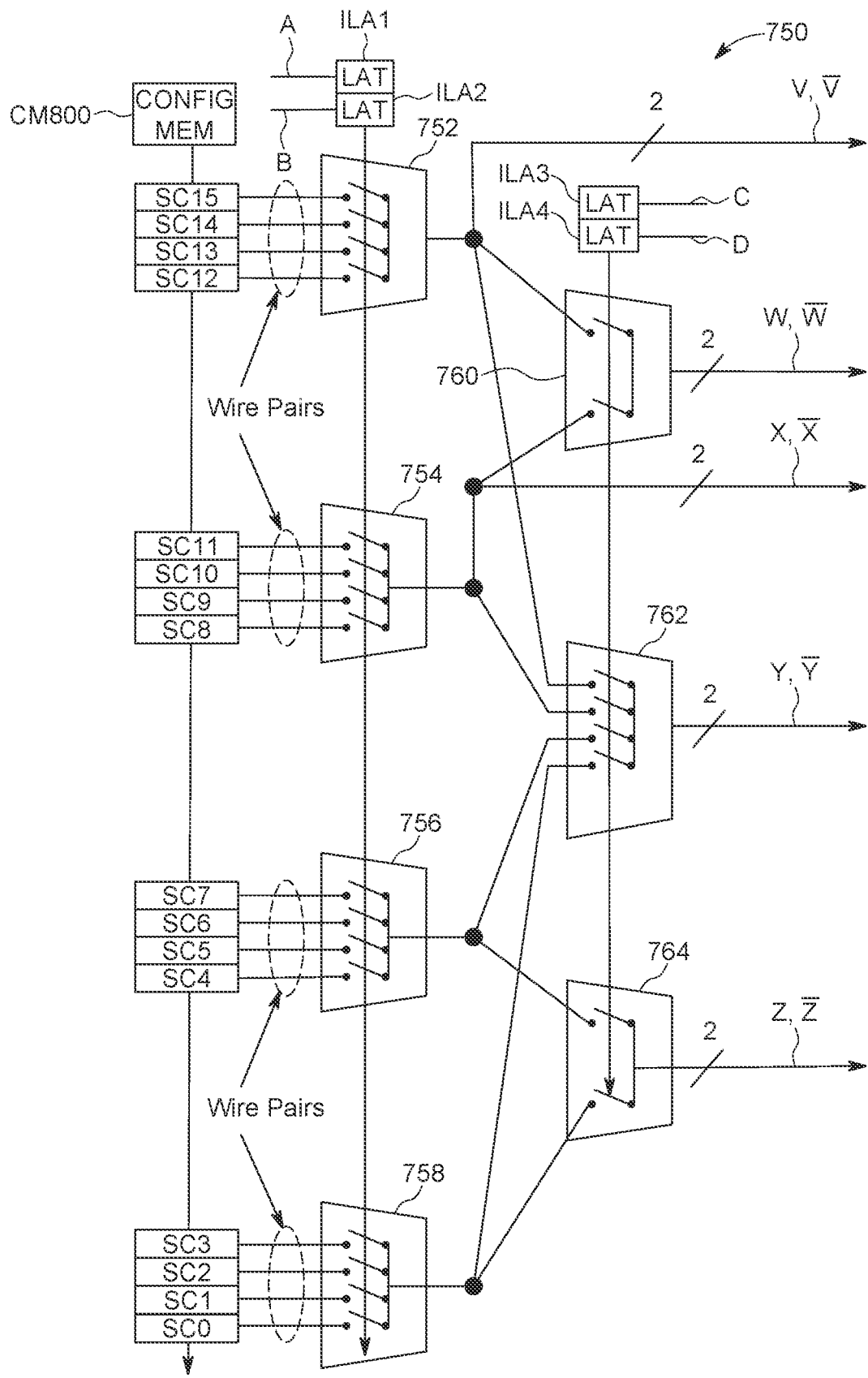
FIG. 28 illustrates a LUT using a fractured multiplexer.

In one embodiment, the LUT 750 in the CLB uses a fracturable multiplexer (FIG. 28). LUT 750 comprises a first set of four multiplexers 752, 754, 756, 758, each of which receives four pairs of input signals generated from configuration memory CM800 and a set of switching circuits SC100 to SC115 similar to configuration memory 700 and switching circuits SC0 to SC15 described with respect to FIG. 27. First set of multiplexers 752, 754, 756 and 758 drive a second set of multiplexers 760, 762 and 764 as shown in FIG. 28. The multiplexers in FIG. 28 are controlled by input signals A, B, C and D as illustrated. In response thereto, LUT 750 generates output signals V, $\overline{\text{V}}$, W, $\overline{\text{W}}$, X, $\overline{\text{X}}$, Y, $\overline{\text{Y}}$, Z and $\overline{\text{Z}}$. These output signals are logic functions of input signals A, B, C and, D, as determined by the configuration data. This is an example of a fracturable look-up table, which enhances signal routability and permits the FPGA to provide more logic functionality from a given set of CLB resources. See FPGA Architecture White Paper WP-01003-1.0, version 1.0, published July, 2006 by Altera Corporation, incorporated herein by reference.

One advantage of having two levels of multiplexers configured as shown in FIG. 28 is reduced signal delay.

Embodiment Using Multiple Look-up Tables in a CLB

Figure 29:
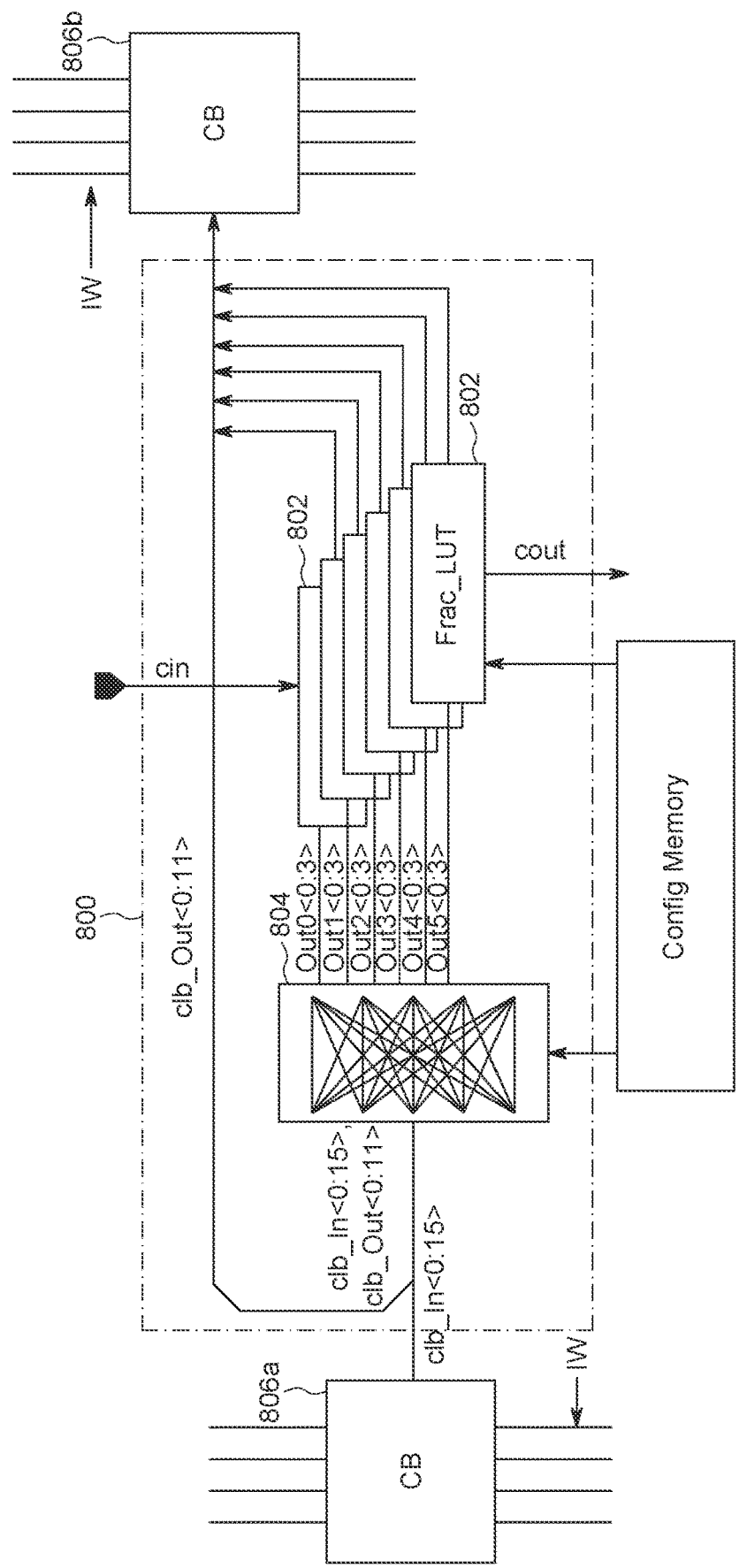
FIG. 29 illustrates a CLB having multiple LUTs.

In one embodiment, each CLB contains multiple look-up tables. For example, in FIG. 29, CLB 800 contains six fractured LUTs 802. LUTs 802 typically have the same design as LUT 750 described above. A crossbar switch block 804 receives input signals from interconnect wiring IW, e.g. via a connection block 806*a*, and permits the routing of the received input signals to any of LUTs 802. Output signals from LUTs 802 are coupled to interconnect wiring IW, e.g. via a connection block 806*b*. The output signals from LUTs 802 are also fed back via crossbar switch block 804 so that further logic functions can be performed on these signals.

As noted above, CLB 102 shown in FIG. 8 has a 4-input LUT 110 and a single output latch OLA1. In other embodiments, the CLBs have larger look-up tables and more latches per CLB along with additional logic for functions such as "carry inputs" and "carry outputs" to form full adders. In addition, the CLBs can use flip-flops in lieu of output latches. For example, in one embodiment, the CLBs can have the functionality such as that contained in a Xilinx XC4000 series FPGA, a Xilinx Virtex FPGA, an Intel Stratix FPGA, Lattice ice FPGA or other logic blocks.

Embodiment Comprising an Array of Integrated Circuits on a Printed Circuit Board In the above embodiment, interconnect wires IW and CLBs 102 are internal to the FPGA integrated circuit. However, in other embodiments, an array of integrated circuits is provided on a printed circuit board (PCB), and a set of interconnect wire traces are provided on the PCB to enable communication between the integrated circuits within the array. This embodiment is similar to the structure of FIG. 7, but instead of an array of CLBs 102 and interconnect wires IW on an integrated circuit, this embodiment comprises an array of integrated circuits and interconnect wiring on the PCB. A resonating circuit provides resonating signal RSR to the integrated circuits, which drive the interconnect wire traces on the PCB to reduce power in the same manner as described above with respect to CLBs. Thus, the integrated circuits provide the resonating signal to communicate one binary value, and a binary voltage to communicate the opposite binary value. The integrated circuits comprise input latches to sample input signals from the interconnect wires as described above with respect to the CLBs. Also, in some of these embodiments, constant capacitive loading on the resonant circuit is maintained as described above. IOBs are provided on the PCB to facilitate communication between the signals on interconnect wiring and structures external to the array.

The integrated circuits typically receive both signal RSR and $\overline{RSR}$ as described above to achieve balanced capacitive loading on both resonant signal leads. This is desirable but not necessary.

While the invention has been described in detail, those skilled in the art will appreciate that changes can be made in form and detail without departing from the spirit and scope of the invention. For example, different aspects of the invention can be practiced independently of other aspects of the invention. Different binary and rail voltages can be used in conjunction with the present invention. In addition, different maximum and minimum voltage swings of resonating signals RSR and QCLK can be used. FPGAs in accordance with my invention may contain different numbers of CLBs, IOBs and switch matrices (typically more than what is depicted in FIG. 7).

In some embodiments, FPGAs in accordance with the invention can be embedded with other circuitry, including programmable or non-programmable logic circuits such as MCUs, DSPs and, GPUs. In some embodiments, these circuits provide output signals comprising binary voltages, but in other embodiments, these circuits provide output signals such as resonating signal RSR to reduce power consumption. FPGAs in accordance with the invention can also be in a stand-alone circuit or combined with other types of circuit blocks. In some embodiments, the FPGA includes blocks of other types of circuits such as blocks of SRAM cells such as blocks of SRAM cells commonly referred to as BRAM (block SRAM) cells in FPGAs. Such SRAM cells can be as described in U.S. Pat. No. 10,510,399 B2, issued to Huffman on Dec. 17, 2019, incorporated herein by reference. The SRAM can include an SRAM decoder as described in U.S. Pat. No. 10,319,422 B2, issued to Huffman on Jun. 11, 2019, incorporated herein by reference.

Different types of resonant circuits, including crystal and LC resonators, can be used in conjunction with the invention. Different types of resonating materials can be used (e.g. as described in U.S. Pat. No. 7,183,868, issued to Wessendorf, col. 7, lines 6-24, incorporated herein by reference). The various switches can be implemented using a single N channel transistor or parallel-connected pairs of N and P channel transistors depending upon whether it is desirable to avoid threshold voltage drops across the switches.

In some embodiments, IOBs are connected to CLBs without going through the main interconnect wiring IW of the FPGA. In some of such embodiments, the signals provided to those CLBs use conventional binary voltages instead of using resonating signals RSR and $\overline{RSR}$.

Different types of switch matrices can be used in conjunction with the invention. For example, the switch matrices can use disjoint, Wilton or universal switching architectures or any combination thereof. See, for example, Mohammed Imran Masud, "FPGA Routing Structures: A Novel Switch Block and Depopulated Interconnect Matrix Architectures", Masters Degree Thesis, University of British Columbia 1998, incorporated by reference. Other switching structures can be used as well.

In some embodiments, only some of the CLBs and IOBs provide resonant signals RSR and/or $\overline{RSR}$ on some lines within interconnect wiring IW, while other CLBs and IOBs provide conventional binary voltages to other lines within interconnect wiring IW. Thus, this aspect of the invention can be employed with some CLBs and IOBs within the array but not all the CLBs and IOBs in the array.

In some of the above-described embodiments, the IOBs are directly connected to CLBs. In other embodiments, the IOBs can be routed via interconnect wiring IW to different CLBs within the array.

As mentioned above, signals QCLK and QCLKDEL are used by pulse generators PG1, PG1a, PG11a to provide pulses to control the latching of data. In other embodiments, signals QCLK and QCLKDEL are used to provide pulses that control other functions and memory circuits within the CLBs and IOBs and the above-mentioned dedicated blocks. Accordingly, such embodiments and modifications come within the scope of the invention.

As mentioned above, the output signals of CLBs 102 change when signal RSR is at a voltage corresponding to a binary 0. In some embodiments, CLBs 102 change state when signal RSR is at a voltage interpreted by the CLBs as a binary 0.

In some embodiments, an array in accordance with the invention can provide a resonating signal from a CLB 102 to a circuit external to the array without being converted into a conventional binary digital signal if the external circuit (e.g. on a printed circuit or a hybrid substrate) is designed to receive and interpret that resonating signal as a binary value. Under such circumstances, it is unnecessary to convert the resonating signal to conventional binary levels.

It will be appreciated that the various static voltages used in an FPGA in accordance with the invention can be generated by circuitry internal to the FPGA in response to a power source external to the FPGA. In other embodiments, these voltages can be provided by a power source external to the FPGA.

Some of the points of novelty disclosed herein include:
Array Comprising Circuit Blocks that Apply a Resonating Signal to their Output Leads 1. Structure comprising:
   a resonating circuit for generating a first resonating signal;
   an array comprising a first set of circuit blocks, each circuit block within said first set of circuit blocks receiving said resonating signal from said resonating circuit, each circuit block within said first set of circuit blocks having a first output lead, said first set of circuit blocks coupling said resonating signal to said first output lead to indicate a first binary value, said first set of circuit blocks coupling a first static voltage to said first output lead to indicate a second binary value; and
   a set of interconnect wires for communicating data between said first set of circuit blocks.
2. Structure of claim 1 wherein said interconnect wires exhibit capacitance and said first output lead of at least one of said blocks provides said resonating signal on at least one of said interconnect wires, and wherein the capacitance of those interconnect wires that receive said first resonating signal cooperates with said resonating circuit to establish a resonance frequency of said first resonating signal.

3. Structure of claim 1 wherein each circuit block within said first set of circuit blocks has a second output lead, said first set of blocks providing first and second output signals on said first and second output leads, respectively, said first output signal being the opposite of said second output signal such that when a block within said first set is in a first state, said block provides said first resonating signal on said first output lead and said static voltage on said second output lead, and when said block within said first set is in a second state, said block provides said static voltage on said first output lead and said resonating signal on said second output lead.

4. Structure of claim 3 wherein the capacitive loading of the first output lead of said first set of blocks cooperates with said resonating circuit to establish a resonating frequency of said first resonating signal when said first resonating signal is coupled to said first output lead, and the capacitive loading of said second output lead cooperates with said resonating circuit to establish said resonating frequency when said first resonating signal is coupled to said second output lead, said capacitive loading tending to remain constant when the signals on said first and second output leads change state.

5. Structure of claim 1 further comprising a second set of circuit blocks, each circuit block within said second set having a first output lead, wherein said resonating circuit provides a second resonating signal to said second set of circuit blocks, each circuit block within said second set of circuit blocks providing said second resonating signal to its first output lead to indicate said second binary value, said second resonating signal being the inverse of said first resonating signal, each circuit block within said second set of circuit blocks providing a second static voltage on its first output lead to indicate said first binary value.

6. Structure of claim 5 wherein said first and second resonating signals are sine waves.

7. Structure of claim 1 wherein said first resonating signal resonates between a voltage equal to said first static voltage and a second voltage and said blocks within said first set comprise at least one input memory for storing an input signal from said interconnect wires at a time when said first resonating signal is at a voltage that is interpreted by said input memory as said first binary value.

8. Structure of claim 1 further comprising a set of input/output circuits for receiving input signals from a source external to said structure and communicating said signals to said blocks, wherein said input circuits receive said first resonating signal and provide either said first resonating signal or said static voltage on a first lead in response to said input signals.

9. Structure of claim 1 further comprising a set of input/output circuits for receiving an input signal from one of said blocks and providing a binary output signal to a destination external to said structure, said input signal being either said first resonating signal or said static voltage, said input/output circuits comprising a memory for storing said input signal when said first resonating signal is at a voltage interpreted by said memory as said first binary value.

10. Structure of claim 1 wherein said structure is an FPGA circuit, and said blocks are CLBs.

Circuit Blocks Receiving a Resonating Signal and Storing a Binary Value.

11. Structure comprising:
a set of interconnect wires for communicating signals; and
a first set of circuit blocks receiving input signals from said interconnect wires and communicating output signals to said interconnect wires to thereby communicate with other circuit blocks within said first set, at least some of the signals communicated on said interconnect wires being a first resonating signal resonating between first and second voltages, said circuit blocks each comprising an input memory circuit for receiving an input signal from one of said interconnect wires and storing a value when said resonating signal is at a voltage interpreted by said input memory circuit as a first binary value.

12. Structure of claim 11 wherein at least some of the signals on said interconnect wires are a static voltage equal to said second voltage, wherein when said input memory circuit receives said static voltage equal to said second voltage, said memory circuit stores a second binary value opposite said first binary value when said resonating signal is at said voltage interpreted by said input memory circuit as said first binary value.

13. Structure of claim 12 wherein at least some of the signals on said interconnect wires are a second resonating signal resonating between said first and second voltages that is the inverse of said first resonating signal such that when said input memory circuit receives said second resonating signal, said input memory circuit stores said second binary value when said first resonating signal is at said voltage interpreted by said input memory circuit as said first binary value.

14. Structure of claim 13 wherein at least some of the signals on said interconnect wires are a static voltage equal to said first voltage, such that when said input memory circuits receive said first voltage, said memory circuits store said first binary value when said first resonating signal is at said voltage interpreted by said input memory circuit as said first binary value.

Structure Comprising Input Circuits that Receive Binary Signals and Provide a Resonating Signal to Circuit Blocks.

15. Structure comprising:
a resonating circuit providing a first resonating signal;
a set of interconnect wires:
a first set of circuit blocks for receiving signals from and communicating signals to said interconnect wires so that said circuit blocks can communicate with one another; and
a first set of input circuits having a first output lead, each input circuit within said first set of input circuits receiving said first resonating signal and receiving an input signal from an associated lead external to said structure and providing said first resonating signal on said first output lead in response to said input signal being in a first state, said input circuits providing a static voltage on said first output lead in response to said input signal being in a second state opposite said first state.

16. Structure of claim 15 wherein said input circuits are input/output circuits that can also receive signals from said circuit blocks and provide those signals to a destination external to said structure.

17. Structure of claim 15 wherein said first set of input circuits comprise a second output lead, each input circuit within said first set providing said first resonating signal on said first output lead and said static voltage on said second output lead in response to said input signal being in said first state, each input circuit within said first set providing said static voltage on said first output lead and said resonating signal on said second output lead in response to said input signal being in said second state.

18. Structure of claim 17 wherein said first and second output leads have capacitive loading such that when said output leads receive said first resonating signal, the capacitive loading of said output leads cooperates with said resonating circuit to establish a resonating frequency of said first resonating signal, and wherein the capacitive loading of said first output lead equals the capacitive loading of said second output lead.

19. Structure of claim 15 wherein said resonating circuit provides a second resonating signal that is the inverse of said first resonating signal, said structure further comprising a second set of input circuits comprising a first output lead, said second set of input circuits receiving a second input signal from an associated lead external to said structure and providing said second resonating signal on its first output lead or a second static voltage on its first output lead in response to the state of said second input signal.

Structure Comprising Output Circuits that Receive a Resonating Signal and Provide a Binary Output Signal to a Destination External to the Structure.

20. Structure comprising:
a resonating circuit for providing a first resonating signal;
a set of interconnect wires;
a set of circuit blocks for receiving input signals from said interconnect wires and providing output signals to said interconnect wires; and
a set of output circuits for receiving an input signal from said circuit blocks and providing a binary output signal to a destination external to said structure, said output circuits each comprising an input memory circuit for receiving said input signal and storing a first binary value when said first resonating signal is at a voltage interpreted by said input memory circuit as said first binary value, such that if said memory circuit receives said first resonating signal, said input memory will store said first binary value.

21. Structure of claim 20 wherein at least some of the signals provided by said circuit blocks are a static voltage equal to a second voltage, wherein when said input memory circuit receives said static voltage equal to said second voltage, said memory circuit stores a second binary value when said resonating signal is at a voltage interpreted by said input memory as said first binary value.

22. Structure of claim 21 wherein at least some of said signals received from some of said circuit blocks are a second resonating signal that is the inverse of said first resonating signal so that when said input memory circuits receive said second resonating signal, said memory circuit stores said second binary value when said first resonating signal is at a voltage interpreted by said input memory as said first binary value.

23. Structure of claim 22 wherein at least some of the signals received from some of said circuit blocks are a static voltage equal to said first voltage, such that when said input memory circuits receive said first voltage, said memory circuits store said first binary value when said first resonating signal is at a voltage interpreted by said input memory as said first binary value.

24. Structure of claim 20 wherein said structure is an FPGA and said output circuits are IOBs.

Structure Comprising Circuit Blocks Receive a Resonating Signal and Store Data at a Time Controlled by the Resonating Signal.

25. Structure comprising:
an array of circuit blocks, each circuit block containing a memory circuit for storing data on a data input lead;
a set of interconnect wires for facilitating communication between said circuit blocks; and
a resonating circuit for providing a first resonating signal to said circuit blocks and controlling the timing of said storing of data from said input lead.

26. Structure of claim 25 wherein said first resonating signal is a sine wave, said structure further comprising a circuit for providing a second resonating signal that is a delayed version of said first resonating circuit delayed by a time period, said circuit blocks further comprising a pulse generator for generating a pulse from said first and second resonating signals, said pulse controlling the timing of said memory circuits.

27. Structure of claim 25 wherein the memory circuit within at least one of said circuit blocks receives a third resonating signal resonating between first and second voltages from one of said interconnect wires, said memory circuit storing said third resonating signal when said third resonating signal is at a voltage interpreted by said memory circuit as a binary value.

28. Structure of claim 25 wherein said memory circuit receives and stores a signal from a logic circuit within said circuit block.

29. Structure of claim 25 wherein said structure is an FPGA and said circuit blocks are CLBs.

An Array of Circuit Blocks and Output Circuits that Store Output Signals from the Circuit Blocks, Wherein the Timing is Controlled by a Resonating Signal.

30. Structure comprising:
an array of circuit blocks;
a set of interconnect wires for facilitating communication between said circuit blocks;
a resonating circuit for providing a first resonating signal;
a set of output circuits for receiving a first input signal from said circuit blocks and providing an output signal to a destination external to said structure, said output circuits comprising a first memory circuit for storing said first input signal, said output circuits comprising a first timing control circuit for controlling the timing of said storing of said first input signal in response to said first resonating signal.

31. Structure of claim 30 wherein said output circuits are input/output circuits comprising a second memory for receiving and storing a second input signal from a source external to said structure, said input/output circuits comprising a second timing control circuit for controlling the timing of said storing of said second input signal in said second memory in response to said resonating signal.

32. Structure of claim 31 wherein said timing control circuits receive a second resonating signal that is a delayed version of said first resonating signal and generates a timing control pulse from said first and second resonating signals.

Array Comprising Input Circuits for Storing a Signal from a Source External to the Array Wherein the Timing is Controlled by a Resonating Signal.

33. Structure comprising:
an array of circuit blocks;

a set of interconnect wires for facilitating communication between said circuit blocks;

a resonating circuit for providing a first resonating signal; and a set of input circuits for receiving a first input signal from a source external to said structure and providing said first input signal to one of said circuit blocks, said input circuits comprising a first memory circuit for storing said first input signal, said input circuits comprising a first timing control circuit for controlling the timing of said storing of said first input signal in response to said first resonating signal.

Method for Having Circuit Blocks within an Array Provide Either a Resonating Signal or Static Voltage to Communicate Binary Data.

34. Method comprising:

providing a first resonating signal from a resonating circuit to a first set of circuit blocks within an array of circuit blocks, interconnect wiring enabling said circuit blocks to communicate with one another, each of said blocks within said first set having an output lead coupled to said interconnect wiring;

providing said first resonating signal on said output lead of one of said blocks within said first set when said one of said blocks is in a first state to communicate a first binary value on said output lead, and providing a static voltage on said output lead when said one of said blocks is in a second state to communicate a second binary value on said output lead.

35. Method of claim 34 wherein said interconnect wires exhibit capacitance, and wherein the capacitance of those interconnect wires that receive said first resonating signal cooperates with said resonating circuit to establish a resonance frequency of said first resonating signal.

36. Method of claim 34 wherein said first set of blocks have first and second output leads, said method further comprising providing first and second output signals on said first and second output leads, such that when each block within said first set is in a first state, said act of providing said first and second output signals comprises providing said first resonating signal on said first output lead and said static voltage on said second output lead, and when each block within said first set is in a second state, said act of providing first and second output signals comprises providing said static voltage on said first output lead and said first resonating signal on said second output lead.

37. Method of claim 36 wherein the capacitive loading of the first and second output leads of said first set of blocks cooperates with said resonating circuit to establish said resonating signal when said first and second output leads receive said resonating signal, said capacitive loading tending to remain constant when said blocks within said first set of blocks change state.

38. Method of claim 34 further comprising providing a second resonating signal from said resonating circuit to a second set of circuit blocks, said second set of blocks comprising a first output lead, said second resonating signal being the inverse of said first resonating signal, said method further comprising providing said second resonating signal to said first output lead of the blocks within said second set to indicate said second binary value, said method further comprising providing a second static voltage on said first output lead of the blocks within said second set to communicate said first binary value.

39. Method of claim 38 wherein said first and second resonating signals are sine waves.

40. Method of claim 34 wherein said first resonating signal resonates between a voltage equal to said first static voltage and a second voltage and said blocks within said first set comprise at least one input memory, said method further comprising storing input signals from said interconnect wires in said input memory at a time when said first resonating signal is at said second voltage.

Method for Storing a Binary Value in an Array of Circuit Blocks at a Time when a Resonating Signal is at a Voltage Interpreted by the Block as a Binary Value.

41. In an array of circuit blocks and a set of interconnect wires for enabling said circuit blocks to communicate with one another, a method comprising:

providing a resonating signal on at least a first one of said interconnect wires to a memory circuit within at least one of said circuit blocks, said resonating signal resonating between a first voltage and a second voltage; and storing said resonating signal in said memory circuit when said signal is at a voltage interpreted by said memory circuit as a first binary value to store a first binary value in said memory circuit.

42. Method of claim 41 further comprising providing a static voltage on at least a second one of said interconnect wires to said a second one of said circuit blocks; and storing said first static voltage in a memory circuit within said second one of said circuit blocks to store a second binary value in said memory circuit at a time when said first resonating signal is at a voltage interpreted by said memory as said first binary value.

43. Method of claim 42 further comprising providing a second resonating signal on at least a third one of said interconnect wires to a third one of said circuit blocks, said second resonating signal being the inverse of said first resonating signal; and storing said second resonating signal in a memory circuit within said third one of said circuit blocks to store said second binary value in said memory circuit when said first resonating signal is at a voltage interpreted by said memory as said first binary value.

44. Method of claim 43 further comprising providing a static voltage equal to said first voltage on at least a fourth one of said interconnect wires to at least a fourth one of said circuit blocks; and storing said static voltage equal to said first voltage in a memory circuit within said fourth one of said circuit blocks to thereby store said first binary value in said memory circuit at a time when said first resonating signal is at a voltage interpreted by said memory as said first binary value.

Method for Receiving a Binary Signal from an External Source and Providing a Signal to a Circuit Block that is Either a Resonating Signal or a Static Voltage in Response to the Received Binary Signal.

45. Method comprising:

receiving a first input signal from a source external to a structure, said structure comprising an array of circuit blocks and a set of interconnect wires being coupled to said circuit blocks for facilitating communication between said circuit blocks;

providing a resonating signal to at least one of said circuit blocks in response to said first input signal being in a first state; and providing a static voltage to said one of said circuit blocks in response to said first input signal being in a second state opposite said first state.

46. Method of claim 45 wherein said circuit blocks and interconnect wires are part of an FPGA and said receiving of said input signal comprises receiving said input signal from a source external to said FPGA.

47. Method of claim 45 further comprising:
receiving a second input signal from a source external to said structure;
providing a second resonating signal to at least a second one of said circuit blocks in response to said second input signal being in said second state, said second resonating signal being the inverse of said first resonating signal;
providing a second static voltage to said at least said second one of said circuit blocks in response to said second input signal being in said first state.

Method in which an Output Circuit Stores a Binary Value in Response to Receiving Either a Resonating Signal or a Static Voltage and Providing that Binary Value to a Destination External to an Array.

48. Method comprising:
receiving a first resonating signal from a circuit block, said circuit block being within an array of circuit blocks, a set of interconnect wires coupled to and facilitating communication between said circuit blocks, said first resonating signal resonating between a first voltage and a second voltage;
storing said first resonating signal in a first memory at a time when said resonating signal is at a voltage interpreted by said first memory as a first binary value to thereby store said first binary value in said first memory; and
providing said first binary value stored in said first memory to a lead external to said array.

49. Method of claim 48 further comprising:
receiving and storing a static voltage equal to said second voltage from a second one of said circuit blocks to thereby store a second binary value in a second memory; and
providing said second binary value stored in said second memory to a second lead external to said array.

50. Method of claim 49 further comprising receiving a second resonating signal from a third one of said circuit blocks and storing said second resonating signal in a third memory at a time when said first resonating signal is at a voltage interpreted by said memory as said first binary value so that said third memory stores said second binary value; and
providing said second binary value stored in said third memory to a third lead external to said array.

51. Method of claim 50 further comprising:
receiving and storing a static voltage equal to said first voltage from a fourth one of said circuit blocks to thereby store said first binary value in a fourth memory; and
providing said first binary value stored in said fourth memory to a fourth lead external to said array.

Method for Controlling the Storing of Signals in Memory Circuits within an Array with a Timing Control Signal Responsive to a Resonating Signal 52. Method comprising:
providing a first resonating signal to an array of circuit blocks, said circuit blocks each comprising a memory circuit for storing an input signal on an input lead, a set of interconnect wires facilitating communication between said circuit blocks;
receiving said first resonating signal with a timing control circuit within said circuit blocks and generating a timing control signal in response to said first resonating signal; and
storing said input signal in said memory in response to said timing control signal.

53. Method of claim 52 further comprising:
providing a second resonating signal that is a delayed version of said first resonating signal delayed by a time period, and
performing a logic function on said first and second resonating signals to generate said timing control signal.

54. Method of claim 53 further comprising providing a third resonating signal from at least one of said interconnect wires to at least one of said circuit blocks, said third resonating signal resonating between first and second voltages, said storing said input signal comprising storing said third resonating signal when said third resonating signal is at a voltage interpreted by said memory as a voltage corresponding to a binary value.

55. Method of claim 54 wherein said circuit blocks generate a digital signal in response to input signals received by said circuit blocks from said interconnect wires, said act of storing said input signal comprising storing said digital signal.

Method for Storing Data in an Output Circuit Wherein Timing is Established by a Resonating Signal 56. A method for providing an output signal from a structure to a destination external to said structure, said structure comprising an array of circuit blocks coupled together by a set of interconnect wires and a set of output circuits having a first input lead coupled to said circuit blocks, said method comprising:
providing a first input signal from one of said circuit blocks to the first input lead of at least one of said output circuits;
providing a first resonating signal to said output circuits;
storing said first input signal in a first memory circuit in said one of said output circuits at a time set in response to said first resonating signal; and
providing the signal stored in said first memory to said destination external to said structure.

57. Method of claim 56 further comprising:
providing a second resonating signal to said output circuits;
providing a timing pulse in response to said first and second resonating signals with a pulse generator within said output circuits, said storing being accomplished in response to a first pulse from the pulse generator within said one of said output circuits.

58. Method of claim 57 wherein said output circuits are input/output circuits, said method further comprising:
receiving a second input signal from a source external to said structure;
storing said second input signal in a second memory within said one of said output circuits in response to a second pulse from said pulse generator; and
providing said stored second input signal to one of said circuit blocks.

Method for Storing an Input Signal from a Source External to an Array in Response to a Resonating Signal.

59. Method comprising:
receiving a first input signal from a source external to a structure, said structure comprising an array of circuit blocks, interconnect wires for enabling communication between said circuit blocks and input circuits for receiving input signals from sources external to said structure, said first input signal being received by one of said input circuits;
providing a first resonating signal to said input circuits;
storing said first input signal in a first memory circuit within said one of said input circuits at a time controlled by said first resonating signal.

60. Method of claim 59 further comprising:
providing a second resonating signal to said input circuits;
generating a timing control signal with a circuit within said one of said input circuits, said timing control signal controlling the timing of said storing of said first input signal; and
providing said stored first input signal to one of said interconnect wires.

Multiplexer Receiving and Communicating Either a Resonating Signal or a Static Voltage.

61. A multiplexer having a first plurality of input leads, said input leads receiving either a static voltage or a resonating signal, said multiplexer selecting one of said input leads and providing the signal from said selected input lead on a multiplexer output lead.

62. Multiplexer of claim 61 wherein said multiplexer is part of a configurable logic block incorporated into an FPGA, said multiplexer comprising a plurality of pairs of input leads and a pair of output leads, a first input lead within each pair receiving a resonating signal, a second input lead within each pair receiving a static voltage, said multiplexer having first and second output leads and providing the signal from said first input lead within a selected one of said pairs on said first output lead and providing the signal from said second input lead within said selected one of said pairs of input leads on said second output lead.

63. Multiplexer of claim 62 wherein said FPGA comprises interconnect wiring and said first and second output leads are coupled to said interconnect wiring.

Method of Performing a Configurable Logic Function by Selecting Either a Resonating Signal or a Static Voltage.

64. A method for performing a configurable logic function comprising:
receiving a plurality of input signals on a set of input leads, said input signals being either resonating input signals or static voltages;
providing a selected one of said input signals on an output lead.

65. Method of claim 64 wherein said step of receiving comprises receiving a plurality of pairs of input signals, one of said input signals within each pair being a resonating input signal, the other of said input signals within each pair being a static voltage, and wherein said step of providing comprises providing a selected pair of said input signals on a pair of output leads.

66. Method of claim 65 further comprising providing said pair of output signals on FPGA interconnect wiring.

I claim:

1. An array comprising:
a resonating circuit for generating a resonating signal;
a set of circuit blocks coupled to said resonating circuit and receiving said resonating signal, said circuit blocks comprising one or more input leads for receiving input signals and one or more output leads for providing an output signal; and
a set of interconnect wires for communicating signals between said circuit blocks, a first group of said circuit blocks applying either said resonating signal to communicate a first value or a static voltage to communicate a second value to one or more of said input leads of one or more circuit blocks within a second group of said circuit blocks via one or more of said output leads of said first group of said circuit blocks and one or more of said interconnect wires.

2. The array of claim 1 wherein said circuit blocks provide first and second output signals on first and second output leads, said circuit blocks providing said static voltage on said second output lead when said resonating signal is on said first output lead, said circuit blocks providing said resonating signal on said second output lead when said static voltage is on said first output lead.

3. The array of claim 2 wherein said input signals are a resonating signal to communicate said first value or a static voltage to communicate said second value.

4. The array of claim 3 wherein said structure is an FPGA and said circuit blocks are configurable logic blocks.

5. The array of claim 3 further comprising a set of input circuits for receiving input signals from a source external to said array and providing either said resonating signal or said static voltage on an output lead in response to said input signals.

6. The array of claim 3 further comprising a set of output circuits for receiving an output signal from said array, said signal being said resonating signal to communicate said first value or said static voltage to communicate said second value, said output circuits providing a binary digital output signal to a destination external to said array in response to said output signal.

7. The array of claim 3 wherein said signals on said interconnect wires change state at a time when said resonant signal is at a voltage interpreted by said circuit blocks as said static voltage to thereby reduce switching power losses.

8. Structure comprising:
a resonating circuit for providing a resonating signal;
a configuration memory for storing configuration bits; and
a configurable logic block having a plurality of input leads for receiving input signals and at least a first output lead, said configurable logic block performing a logic function, said logic function being selected in response to said configuration bits, said configurable logic block providing said resonating signal on said output lead in response to said input signals and said configuration bits to communicate a first binary value, said configurable logic block providing a static voltage on said output lead in response to said input signals and said configuration bits to communicate a second binary value.

9. Structure of claim 8 wherein said configurable logic block has a second output lead, said configurable logic block providing said static voltage on said second output lead when said resonating signal is on said first output lead, said configurable logic block providing said resonating signal on said second output lead when said configurable logic block provides said static voltage on said first output lead.

10. In an array comprising a set of circuit blocks comprising one or more input leads and one or more output leads, said array also comprising a set of interconnect wires for communicating signals between the output leads and input leads of said circuit blocks, a method comprising:
providing a resonating signal on the output lead of a first group of said circuit blocks to communicate said resonating signal via said interconnect wires to communicate a first binary value to one or more input leads of one or more circuit blocks within a second group of said blocks and a static voltage on the output lead of said first group of said circuit blocks to communicate said static voltage via said interconnect wires to communicate a second binary value to said one or more input leads of said one or more circuit blocks within said second group of said blocks.

11. Method of claim 10 further comprising causing said circuit blocks to provide first and second output signals on first and second output leads, said circuit blocks providing said resonating signal and said static voltage on said first and second output leads, respectively, to communicate said first value, said circuit blocks providing said static voltage and said resonating signal on said first and second output leads, respectively, to communicate said second value.

12. Method of claim 11 wherein said method further comprises receiving input signals on said input leads, said input signals being said resonating signal to communicate said first value or said static voltage to communicate said second value.

13. Method of claim 12 wherein said array is an FPGA and said circuit blocks are configurable logic blocks.

14. Method of claim 13 further comprising receiving input signals from a source external to said array with a set of input circuits and providing either said resonating signal or said static voltage on an output lead of said input circuits in response to said input signals.

15. Method of claim 13 wherein a resonant circuit is coupled to said circuit blocks, said resonant circuit providing said resonating signal.

16. Method of claim 13 further comprising receiving an output signal from said array, said signal being said resonating signal to communicate said first binary value or said static voltage to communicate said second binary value, and providing a binary digital output signal to a destination external to said array in response to said received output signal, said binary digital output signal comprising either a first static voltage or a second static voltage to communicate said first or second binary value.

17. Method of claim 16 further comprising changing the state of the signals on said interconnect wires at a time when said resonant signal is at a voltage interpreted by said circuit blocks as said static voltage to thereby reduce switching power losses.

18. Method comprising:
providing a resonating signal, a set of input signals and configuration bits to a configurable logic block to thereby cause said configurable logic block to perform a logic function selected in response to said configuration bits;
causing said configurable logic block to provide said resonating signal on a first output lead in response to said input signals and configuration bits to communicate a first binary value, said first binary value being said logic function of said input signals; and
causing said configurable logic block to provide a static voltage on said first output lead in response to said input signals and configuration bits to communicate a second binary value, said second binary value being said logic function of said input signals.

19. Method of claim 18 wherein said configurable logic block comprises a second output lead, said method further comprising:
causing said configurable logic block to provide said static voltage on said second output lead when said resonating signal is on said first output lead; and
causing said configurable logic block to provide said resonating signal on said second output lead when said static voltage is present on said first output lead.

20. Array of claim 1 wherein said circuit blocks further comprise: one or more input circuits for receiving said input signals from one of said input leads, said input signals being said resonating signal or said static voltage, said input circuits providing binary static output voltages in response to said input signals;
a logic circuit for performing a logic function on said binary static output voltages and providing a binary digital logic static output voltage in response thereto; and
an output circuit for receiving said digital logic static output voltage and providing said output signal on said output lead in response thereto, wherein said output signal is either said resonating signal or said static voltage.

21. Structure of claim 8 wherein said configurable logic block comprises a look-up table that selects a configuration bit in response to said input signals, said configuration bit determining the signal on said output lead.

22. Structure of claim 21 wherein said look-up table comprises a multiplexer comprising a plurality of pairs of multiplexer input leads and a pair out output leads, a first one of said of pairs of input leads receiving said resonating signal, a second one of said pairs of input leads receiving said static voltage, said multiplexer coupling a selected one of said pairs of input leads to said pair of output leads.

23. Method of claim 10 said input signals are said resonating signal or said static voltage, said method further comprising:
providing binary static output voltages to a logic circuit within said circuit blocks in response to said input signals, said logic circuits providing a binary digital logic static output voltage in response thereto; and
providing said output signal on said output lead in response to said binary digital logic static output voltage, wherein said output signal is either said resonating signal or said static voltage.

24. Method of claim 18 wherein said configurable logic blocks comprise a look-up table, said method comprising selecting a configuration bit in response to said input signals, said configuration bit determining the signal on said output lead.

25. Method of claim 24 wherein said look-up table comprises a multiplexer having a plurality of pairs of input leads and a pair of output leads, one of said input leads within each pair communicating said resonating signal, the other of said input leads within each pair communicating said static voltage, said method further comprising connecting a selected one of said pairs of input leads to said pair of output leads.

* * * * *